United States Patent
Nogiwa et al.

(10) Patent No.: US 10,483,713 B2
(45) Date of Patent: Nov. 19, 2019

(54) LASER APPARATUS AND MEASUREMENT UNIT

(71) Applicant: GIGAPHOTON INC., Tochigi (JP)

(72) Inventors: Seiji Nogiwa, Tochigi (JP); Yasufumi Kawasuji, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 64 days.

(21) Appl. No.: 15/698,412

(22) Filed: Sep. 7, 2017

(65) Prior Publication Data

US 2017/0373461 A1     Dec. 28, 2017

Related U.S. Application Data

(63) Continuation of application No. PCT/JP2016/062584, filed on Apr. 21, 2016.

(30) Foreign Application Priority Data

Apr. 23, 2015  (WO) .................. PCT/JP2015/062394

(51) Int. Cl.
*H01S 3/0941*  (2006.01)
*H01S 3/10*  (2006.01)
(Continued)

(52) U.S. Cl.
CPC ............ *H01S 3/0941* (2013.01); *H01S 3/104* (2013.01); *H01S 3/10007* (2013.01);
(Continued)

(58) Field of Classification Search
CPC .... H01S 3/0941; H01S 3/10007; H01S 3/104; H01S 3/235; H01S 3/23; H01S 3/10;
(Continued)

(56) References Cited

U.S. PATENT DOCUMENTS 7,283,243 B2    10/2007  Langford et al.
8,000,212 B2     8/2011  Senekerimyan et al.
(Continued)

FOREIGN PATENT DOCUMENTS

JP    H02-030598 A    1/1990
JP    2005-522694 A   7/2005
(Continued)

OTHER PUBLICATIONS

International Search Report issued in PCT/JP2016/062584; dated Jul. 19, 2016.
(Continued)

*Primary Examiner* — Xinning (Tom) Niu
(74) *Attorney, Agent, or Firm* — Studebaker & Brackett PC

(57) ABSTRACT

A laser apparatus may include: a quantum cascade laser outputting, based on a supplied current, laser light at an oscillation start timing when a first delay time elapses from a current rising timing of the supplied current: an amplifier disposed in a laser light optical path, and selectively amplifying light of a predetermined wavelength to output the amplified laser light to a chamber including a plasma generation region into which a target is fed; and a laser controller controlling a third delay time, from an output timing of a laser output instruction to the current rising timing, to cause a laser light wavelength to be equal to the predetermined wavelength at an aimed timing when a second delay time elapses from the oscillation start timing, based on oscillation parameters including the first delay time, a supplied current waveform, and a device temperature of the quantum cascade laser.

4 Claims, 20 Drawing Sheets

(51) Int. Cl.
*H01S 3/104* (2006.01)
*H01S 3/23* (2006.01)
*H05G 2/00* (2006.01)
*H01S 3/101* (2006.01)

(52) U.S. Cl.
CPC ............. *H01S 3/235* (2013.01); *H05G 2/008* (2013.01); *H01S 3/101* (2013.01)

(58) Field of Classification Search
CPC ........ H01S 5/068; H01S 3/101; H01S 5/3401; H05G 2/008
See application file for complete search history.

(56) References Cited

U.S. PATENT DOCUMENTS

| | | | |
|---|---|---|---|
| 9,318,864 | B2 | 4/2016 | Nowak et al. |
| 2010/0220756 | A1 | 9/2010 | Krzysztof et al. |
| 2012/0250710 | A1 | 10/2012 | Yoshino et al. |
| 2013/0148674 | A1* | 6/2013 | Nowak ............... H01S 5/06216 372/26 |
| 2014/0341239 | A1 | 11/2014 | Yoshino et al. |
| 2016/0266466 | A1* | 9/2016 | Milchberg ............ G02F 1/3511 |

FOREIGN PATENT DOCUMENTS

| | | |
|---|---|---|
| JP | 2009-099727 A | 5/2009 |
| JP | 2010-226096 A | 10/2010 |
| JP | 2012-182434 A | 9/2012 |
| JP | 2012-204820 A | 10/2012 |
| JP | 2013-065804 A | 4/2013 |
| JP | 2013-513929 A | 4/2013 |

OTHER PUBLICATIONS

International Preliminary Report on Patentability and Written Opinion Issued in PCT/JP2016/062584; dated Oct. 24, 2017.

* cited by examiner

LASER APPARATUS AND MEASUREMENT UNIT

CROSS REFERENCE TO RELATED APPLICATIONS

The present application is a continuation application of International Application No. PCT/JP2016/062584, filed on Apr. 21, 2016. The content of the application is incorporated herein by reference in its entirety.

BACKGROUND

The present disclosure relates to a laser apparatus and a measurement unit both using a quantum cascade laser (QCL).

In recent years, miniaturization of a transcription pattern of an optical lithography in a semiconductor process is drastically progressing with the development in fining of the semiconductor process. In the next generation, microfabrication on the order of 70 nm to 45 nm, and further microfabrication on the order of 32 nm or less are bound to be required. To meet such requirement for the microfabrication on the order of, for example, 32 nm or less, development is anticipated of an exposure unit that includes a combination of a reduced projection reflective optics and an extreme ultraviolet light generating apparatus that generates extreme ultraviolet (EUV) light of a wavelength of about 13 nm.

Three types of apparatuses have been proposed for the extreme ultraviolet light generating apparatus, which are a laser produced plasma (LPP) apparatus that uses plasma generated by application of laser light to a target substance, a discharge produced plasma (DPP) apparatus that uses plasma generated by electric discharge, and a synchrotron radiation (SR) apparatus that uses orbital radiation light. For example, reference is made to Japanese Unexamined Patent Application Publication (Published Japanese Translation of PCT Application) No. 2013-513929, Japanese Unexamined Patent Application Publication (Published Japanese Translation of PCT Application) No. 2005-522694, Japanese Unexamined Patent Application Publication No. 2013-65804, Japanese Examined Patent Application Publication No. H02-30598, and Japanese Unexamined Patent Application Publication No. 2012-182434.

SUMMARY

A laser apparatus according to a first aspect of the present disclosure may include a quantum cascade laser, an amplifier, and a laser controller. The quantum cascade laser may be configured to output, on a basis of a supplied current, laser light at an oscillation start timing at which a first delay time elapses from a current rising timing of the supplied current. The amplifier may be disposed in an optical path of the laser light, and may be configured to selectively amplify light of a predetermined wavelength to output the amplified laser light to a chamber. The chamber may include a plasma generation region into which a target is to be fed. The laser controller may be configured to control, on a basis of a plurality of oscillation parameters, a third delay time to cause a wavelength of the laser light to be equal to the predetermined wavelength at an aimed timing at which a second delay time elapses from the oscillation start timing. The oscillation parameters may include the first delay time, a current waveform of the supplied current, and a device temperature of the quantum cascade laser. The third delay time may be a time period from an output timing of a laser output instruction to the current rising timing. The laser output instruction may be an instruction on the output of the laser light. The aimed timing may be determined on a basis of a time period required for the laser light of the predetermined wavelength to reach the plasma generation region from the output of the laser light of the predetermined wavelength from the quantum cascade laser and on a basis of a timing at which the target reaches the plasma generation region.

A laser apparatus according to a second aspect of the present disclosure may include a quantum cascade laser, a measuring device, a measurement controller, and a laser controller. The quantum cascade laser may be configured to output, on a basis of a supplied current, laser light at an oscillation start timing at which a first delay time elapses from a current rising timing of the supplied current. The measuring device may be configured to measure a second delay time. The second delay time may be a time period from the oscillation start timing to a timing at which a wavelength of the laser light is equal to a predetermined wavelength. The measurement controller may be configured to control, on a basis of a plurality of oscillation parameters, oscillation of the quantum cascade laser, and vary the second delay time to output specific oscillation information. The oscillation parameters may include the first delay time, a current waveform of the supplied current, and a device temperature of the quantum cascade laser. The second delay time may be varied by varying one or more of the oscillation parameters excluding the first delay time. The specific oscillation information may be information on the oscillation parameters that are at a timing at which the second delay time reaches a predetermined time. The laser controller may be configured to control, on a basis of the specific oscillation information, the oscillation of the quantum cascade laser to cause the wavelength of the laser light to be equal to the predetermined wavelength at an aimed timing.

A measurement unit according to a third aspect of the present disclosure may include a measuring device, and a measurement controller. The measuring device may be configured to measure a second delay time. The second delay time may be a time period from an oscillation start timing at which a first delay time elapses to a timing at which a wavelength of laser light, outputted on a basis of a supplied current by a quantum cascade laser at the oscillation start timing, is equal to a predetermined wavelength. The measurement controller may be configured to control, on a basis of a plurality of oscillation parameters, oscillation of the quantum cascade laser, and vary the second delay time to output specific oscillation information. The oscillation parameters may include the first delay time, a current waveform of the supplied current, and a device temperature of the quantum cascade laser. The second delay time may be varied by varying one or more of the oscillation parameters excluding the first delay time. The specific oscillation information may be information on the oscillation parameters that are at a timing at which the second delay time reaches a predetermined time.

BRIEF DESCRIPTION OF THE DRAWINGS

Some example embodiments of the present disclosure are described below as mere examples with reference to the accompanying drawings.

DETAILED DESCRIPTION

Figure 1:
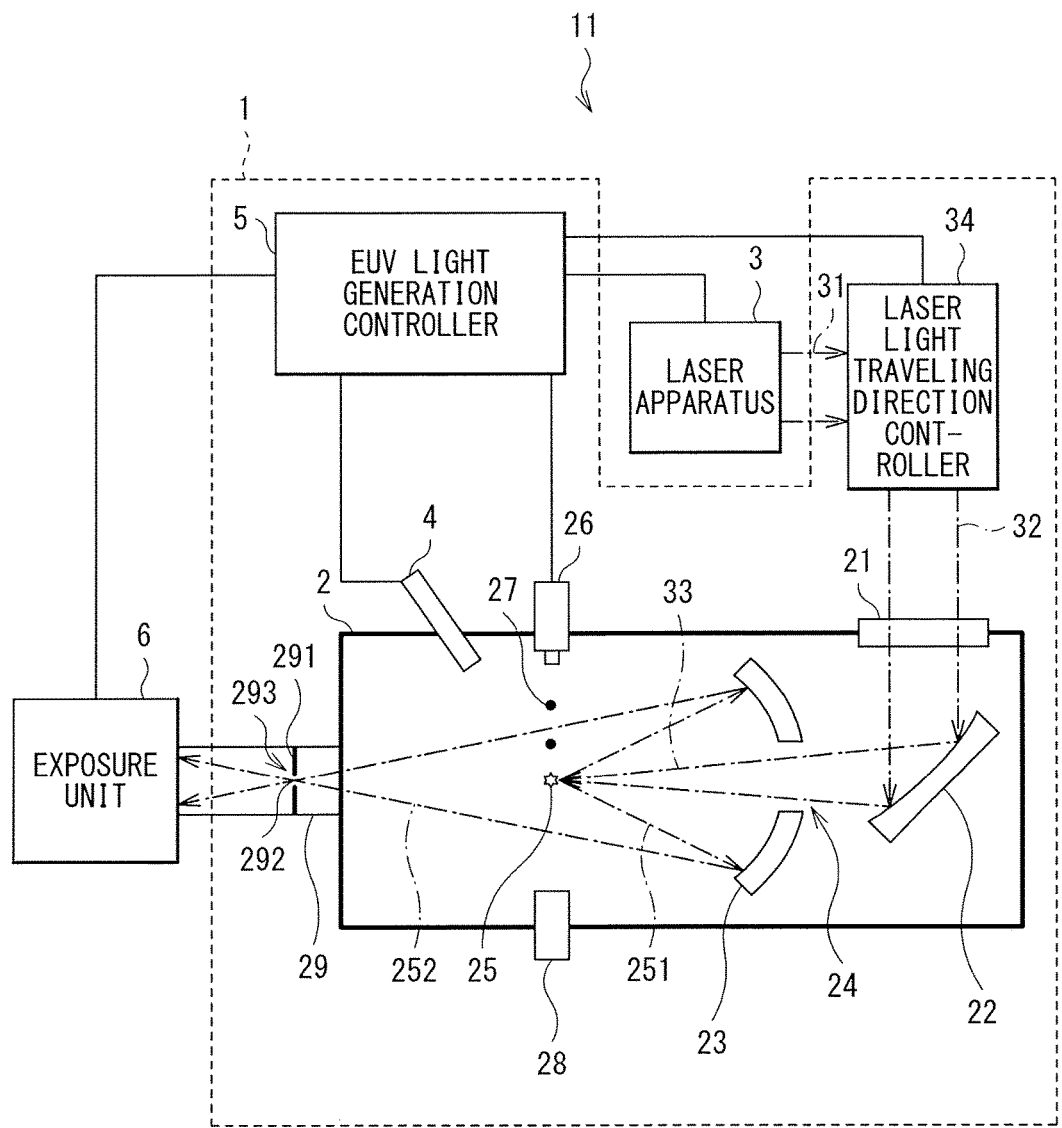
FIG. 1 schematically illustrates a configuration example of an illustrative LPP EUV light generating system.

[Contents]
[1. Overview]
[2. Overall Description of EUV Light Generating Apparatus] (FIG. 1)
   2.1 Configuration
   2.2 Operation
[3. Description of Laser Apparatus including QCL]
   3.1 Overall description of laser apparatus including QCL
      3.1.1 Configuration (FIG. 2A and FIG. 2B)
      3.1.2 Operation
   3.2 Description of regenerative amplifier
      3.2.1 Configuration (FIG. 3)
      3.2.2 Operation
   3.3 Issues of laser apparatus including QCL (FIG. 4 to FIG. 6)
      3.3.1 Description of key part of laser apparatus including QCL
      3.3.2 Issues
[4. First Embodiment]
   4.1 Laser apparatus (FIG. 7 to FIG. 11)
      4.1.1 Configuration
      4.1.2 Operation
      4.1.3 Workings
   4.2 First example of measurement unit (FIG. 12 to FIG. 14)
      4.2.1 Configuration
      4.2.2 Operation
      4.2.3 Workings
   4.3 Second example of measurement unit (FIG. 15 and FIG. 16)
      4.3.1 Configuration
      4.3.2 Operation
      4.3.3 Workings
[5. Second Embodiment] (Laser apparatus including a plurality of QCLs) (FIG. 17 and FIG. 18)
   5.1 Configuration
   5.2 Operation
   5.3 Workings
[6. Third Embodiment] (Laser apparatus provided with a measurement function) (FIG. 19 and FIG. 20)
   6.1 Configuration
   6.2 Operation
   6.3 Workings
[7. Hardware Environment of Controller] (FIG. 21)
[8. Et Cetera]

In the following, some example embodiments of the present disclosure are described in detail with reference to the drawings. Example embodiments described below each illustrate one example of the present disclosure and are not intended to limit the contents of the present disclosure. Further, all of the configurations and operations described in each example embodiment are not necessarily essential for the configurations and operations of the present disclosure. Note that the like elements are denoted with the same reference numerals, and any redundant description thereof is omitted.

1. Overview

The present disclosure relates to a laser apparatus and a measurement unit both using a quantum cascade laser.

2. Overall Description of EUV Light Generating System

[2.1 Configuration]

FIG. 1 schematically illustrates a configuration of an illustrative laser produced plasma (LPP) extreme ultraviolet (EUV) light generating system. An EUV light generating apparatus 1 may be used together with one or more laser apparatuses 3. In some embodiments of the present application, a system including the EUV light generating apparatus 1 and the laser apparatus 3 is referred to as an EUV light generating system 11. As illustrated in FIG. 1 and as described in detail below, the EUV light generating apparatus 1 may include a chamber 2 and, for example, a target feeder 26 serving as a target feeding unit. The chamber 2 may be sealable. The target feeder 26 may be so attached as to penetrate a wall of the chamber 2, for example. A material of a target substance to be fed from the target feeder 26 may be tin, terbium, gadolinium, lithium, xenon, or any combination of two or more thereof without limitation.

One or more through holes may be provided on the wall of the chamber 2. The through hole may be provided with a window 21. Pulsed laser light 32 outputted from the laser apparatus 3 may pass through the window 21. For example, an EUV light concentrating mirror 23 including a spheroidal reflection surface may be disposed inside the chamber 2. The EUV light concentrating mirror 23 may include a first focal point and a second focal point. A multilayer reflection film in which, for example, molybdenum and silicon are alternately stacked may be provided on a surface of the EUV light concentrating mirror 23. The EUV light concentrating mirror 23 may be preferably disposed in such a manner that, for example, the first focal point is located in a plasma generation region 25 or in the vicinity of the plasma generation region 25 and the second focal point is located at an intermediate focus point (IF) 292 that is a desired light concentration position defined by specifications of an exposure unit 6. A through hole 24 may be provided at a center part of the EUV light concentrating mirror 23, and pulsed laser light 33 may pass through the through hole 24.

The EUV light generating apparatus 1 may include an EUV light generation controller 5. The EUV light generation controller 5 may include a target sensor 4, etc. The target sensor 4 may detect one or more of presence, trajectory, position, and speed of a target 27. The target sensor 4 may include an imaging function.

The EUV light generating apparatus 1 may further include a connection section 29 that allows the inside of the chamber 2 to be in communication with the inside of the exposure unit 6. A wall 291 provided with an aperture 293 may be provided inside the connection section 29. The wall 291 may be disposed so that the aperture 293 is located at the second focal point of the EUV light concentrating mirror 23.

The EUV light generating apparatus 1 may further include a laser light traveling direction controller 34, a laser light concentrating mirror 22, a target collector 28, etc. The target collector 28 may collect the target 27. The laser light traveling direction controller 34 may include, in order to control a traveling direction of laser light, an optical device that defines the traveling direction of the laser light and an actuator that adjusts position, attitude, etc., of the optical device.

[2.2 Operation]

Referring to FIG. 1, pulsed laser light 31 outputted from the laser apparatus 3 may travel through the laser light traveling direction controller 34, and the pulsed laser light 31 that has passed through the laser light traveling direction controller 34 may enter, as the pulsed laser light 32, the chamber 2 after passing through the window 21. The pulsed laser light 32 may travel inside the chamber 2 along one or more laser light paths, and then may be reflected by the laser light concentrating mirror 22. The pulsed laser light 32 reflected by the laser light concentrating mirror 22 may be applied, as the pulsed laser light 33, to one or more targets 27.

The target feeder 26 may be configured to output the target 27 to the plasma generation region 25 inside the chamber 2. The target 27 may be irradiated with one or more pulses included in the pulsed laser light 33. The target 27 irradiated with the pulsed laser light may be turned into plasma, and EUV light 251 may be radiated together with radiation light from the plasma. The EUV light 251 may be reflected and concentrated by the EUV light concentrating mirror 23. EUV light 252 reflected by the EUV light concentrating mirror 23 may be outputted to the exposure unit 6 through the intermediate focus point 292. Note that a plurality of pulses included in the pulsed laser light 33 may be applied to one target 27.

The EUV light generation controller 5 may be configured to manage a control of the entire EUV light generating system 11. The EUV light generation controller 5 may be configured to process, for example, data of an image of the target 27 picked up by the target sensor 4. For example, the EUV light generation controller 5 may be configured to control one or both of an output timing of the target 27 and an output direction of the target 27.

For example, the EUV light generation controller 5 may be configured to control one or more of oscillation timing of the laser apparatus 3, the traveling direction of the pulsed laser light 32, and a concentration position of the pulsed laser light 33. The above-described various controls are illustrative, and other control may be added as necessary.

3. Description of Laser Apparatus Including QCL

[3.1 Overall Description of Laser Apparatus Including QCL]
[3.1.1 Configuration]

Figure 2A:
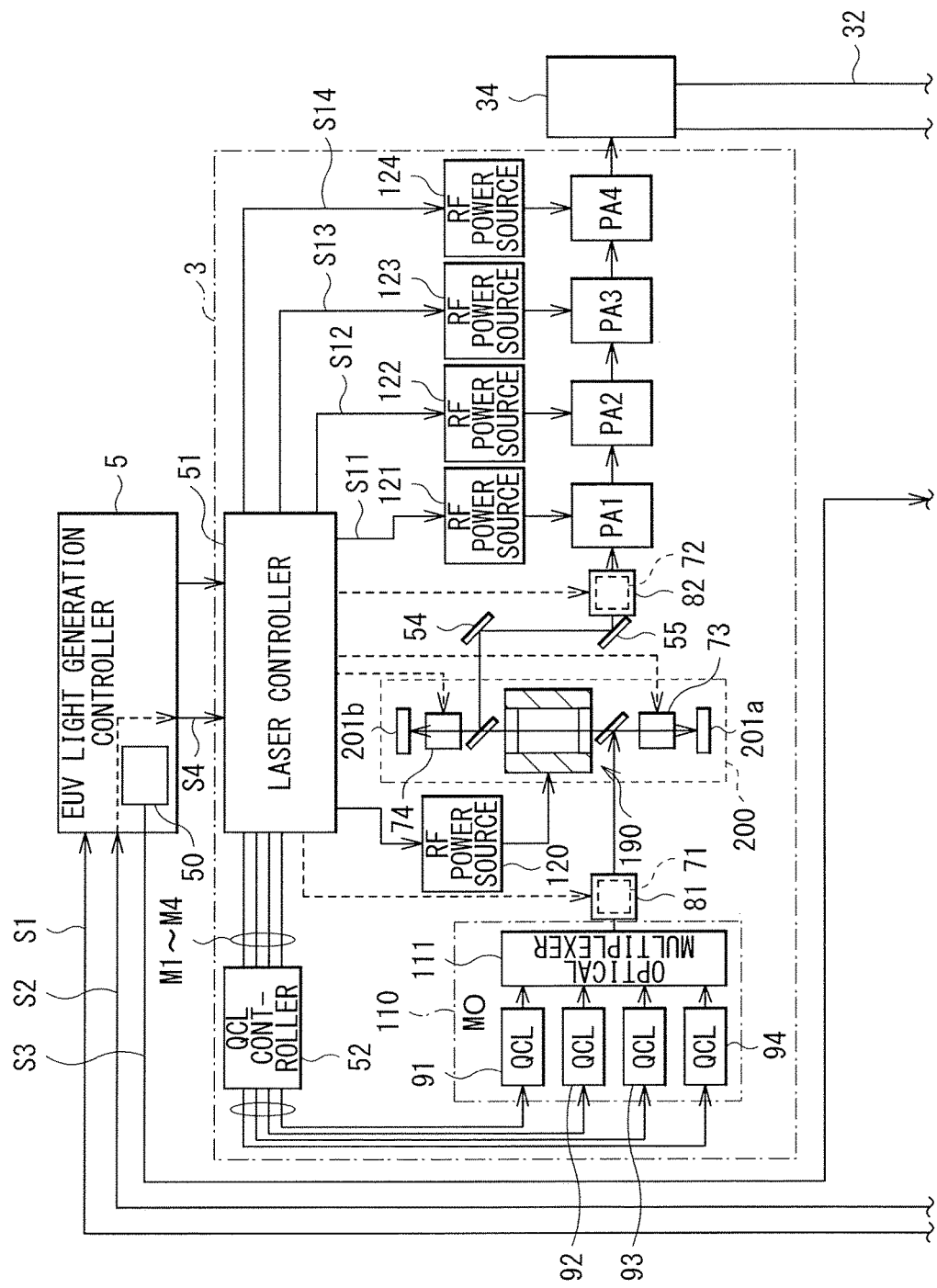
FIG. 2A schematically illustrates a configuration example of a key part of an EUV light generating system provided with a laser apparatus including a QCL.
Figure 2B:
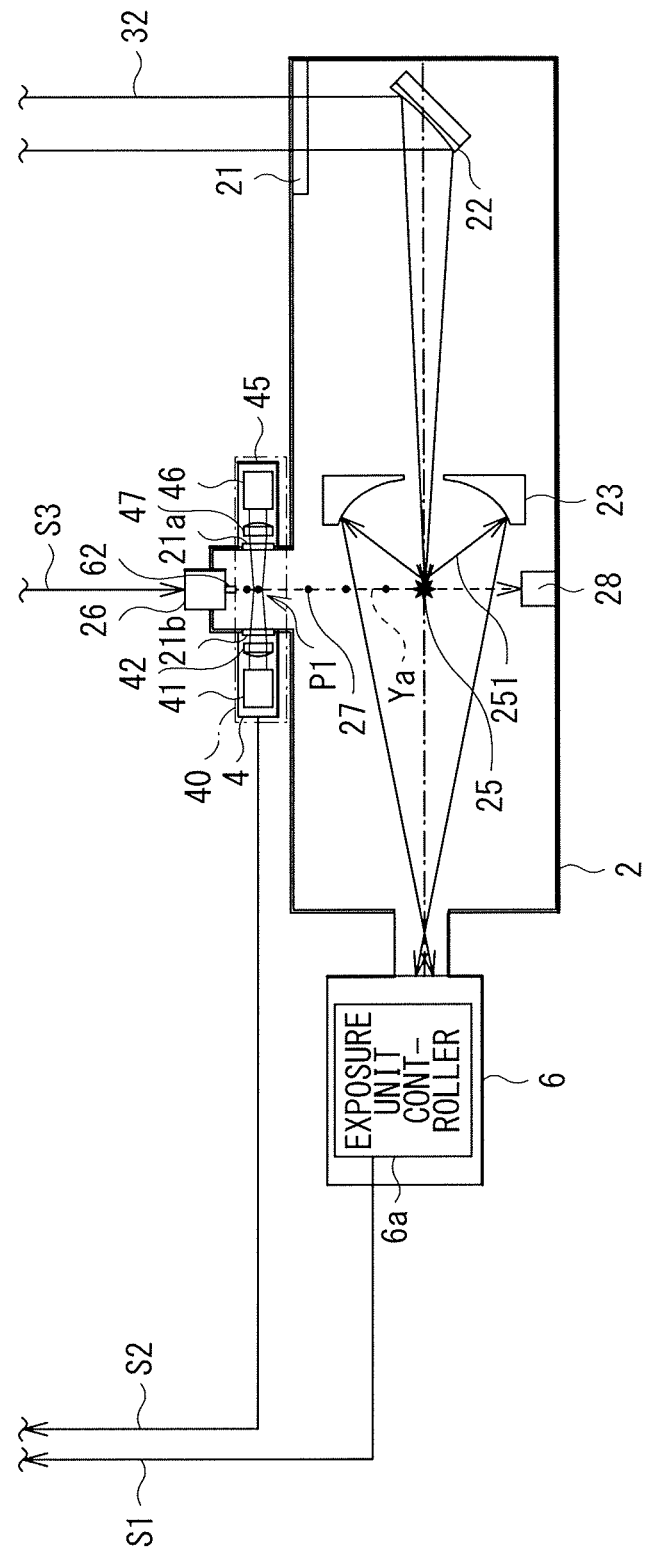
FIG. 2B schematically illustrates a configuration example of a key part of the EUV light generating system provided with the laser apparatus including the QCL.

FIG. 2A and FIG. 2B each schematically illustrate a configuration example of a key part of the EUV light generating system provided with the laser apparatus including a quantum cascade laser (QCL). In FIG. 2A and FIG. 2B, substantially the same elements of the EUV light generating system 11 illustrated in FIG. 1 are denoted with the same reference numerals, and description thereof is omitted where appropriate. FIG. 2A mainly illustrates a configuration example of the laser apparatus 3. FIG. 2B mainly illustrates a configuration example of each of the chamber 2 and peripheral parts of the chamber 2.

The laser apparatus 3 may include a laser controller 51, a QCL controller 52, a reflection mirror 54, a reflection mirror 55, a master oscillator (MO) 110, a regenerative amplifier 200, amplifiers PA1 to PA4, and first and second optical isolators 81 and 82. The laser apparatus 3 may also include an RF power source 120 coupled to the regenerative amplifier 200, and RF power sources 121 to 124 coupled, respectively, to the amplifiers PA1 to PA4.

The EUV light generation controller 5 may include a master trigger generator 50.

The MO 110 may include a plurality of semiconductor lasers and an optical multiplexer 111. The plurality of semiconductor lasers may be QCL 91 to QCL 94. The QCL controller 52 may be coupled to the QCL 91 to QCL 94. The QCL 91 to QCL 94 may be each a quantum cascade laser (QCL) that outputs laser light including an amplification wavelength region of an amplification medium containing a $CO_2$ gas, in accordance with a pulse-like supplied current. Note that FIG. 2A illustrates an example in which four QCLs, i.e., QCL 91 to QCL 94 are disposed; however, the number of the QCLs may be less than or more than four.

The optical multiplexer 111 may be disposed and configured to allow optical paths of the respective beams of the laser light outputted from the four QCLs, i.e., the QCL 91 to QCL 94 to substantially coincide with one another. Non-limiting examples of the optical multiplexer 111 to be used may include a diffraction grating, a coupled optical waveguide, and a prism.

The first optical isolator 81 may be disposed as an optical shutter in an optical path of laser light outputted from the MO 110. The second optical isolator 82 may be disposed as an optical shutter in an optical path between the regenerative amplifier 200 and the amplifier PA1 via the reflection mirror 54 and the reflection mirror 55. Note that the number and the disposition of the optical isolators are not limited thereto. For example, the optical isolator may be disposed between adjacent amplifiers of the amplifiers PA1 to PA4. The first optical isolator 81 may include a first Pockels cell 71. The second optical isolator 82 may include a second Pockels cell 72. The first and second Pockels cells 71 and 72 may be each an electro optical (EO) Pockels cell. The first and second Pockels cells 71 and 72 may be each coupled to an unillustrated power source.

The regenerative amplifier 200 and the amplifiers PA1 to PA4 may be each an amplifier that selectively amplifies light of a predetermined wavelength.

The regenerative amplifier 200 may be disposed in the optical path of the laser light outputted from the MO 110 through the first optical isolator 81. The regenerative amplifier 200 may be a laser amplifier that contains a $CO_2$ gas as a laser medium. The regenerative amplifier 200 may include first and second resonator mirrors 201a and 201b, third and fourth Pockels cells 73 and 74, and an amplifier 190. The third and fourth Pockels cells 73 and 74 may be each disposed between the first and second resonator mirrors 201a and 201b. The amplifier 190 may be disposed between the third and fourth Pockels cells 73 and 74. The third and fourth Pockels cells 73 and 74 may be each the EO Pockels cell. The third and fourth Pockels cells 73 and 74 may be each the optical shutter. The third and fourth Pockels cells 73 and 74 may be each coupled to the unillustrated power source. Note that a more detailed configuration of the regenerative amplifier 200 is described later with reference to FIG. 3.

The amplifiers PA1 to PA4 may be each disposed in an optical path of laser light outputted from the regenerative amplifier 200. The amplifiers PA1 to PA4 may be each the laser amplifier containing a $CO_2$ gas as the laser medium. Note that FIG. 2A illustrates an example in which four amplifiers PA1 to PA4 are provided; however, the number of the amplifiers may be less than or more than four.

The laser controller 51 may be coupled to each of the QCL controller 52, unillustrated respective power sources of the first to fourth Pockels cells 71 to 74, the RF power source 120, and the RF power sources 121 to 124. The laser controller 51 may further be coupled to the EUV light generation controller 5.

As illustrated in FIG. 2B, the chamber 2 may be provided with the target feeder 26 and a target detector 40.

In the chamber 2, the target detector 40 may be disposed on a trajectory of the target 27. The target detector 40 may measure a passing timing of the target 27. The target detector 40 may include the target sensor 4 and a light source section 45. The light source section 45 may include a light source 46 and an illumination optical system 47. The light source section 45 may be so disposed as to illuminate the target 27 at a predetermined position P1 on a trajectory Ya between a nozzle 62 of the target feeder 26 and the plasma generation region 25. The target sensor 4 may include a photosensor 41 and a light-receiving optical system 42. The target sensor 4 may be so disposed as to receive illumination light outputted from the light source section 45.

The target sensor 4 may be disposed on opposite side of the light source section 45 with the trajectory Ya of the target 27 in between. The chamber 2 may be provided with a window 21a and a window 21b. The window 21a may be positioned between the light source section 45 and the trajectory Ya of the target 27. The light source section 45 may concentrate light on the predetermined position P1 of the trajectory Ya of the target 27 through the window 21a. The window 21b may be positioned between the trajectory Ya of the target 27 and the target sensor 4. A detection position of the target 27 to be detected by the target sensor 4 may substantially coincide with a position on which light may be concentrated by the light source section 45. The target sensor 4 may output a target detection signal S2 as a detection signal of the target 27. The target detection signal S2 outputted from the target sensor 4 may be inputted to the EUV light generation controller 5. A piezoelectric drive signal S3 may be inputted to the target feeder 26 from the master trigger generator 50 of the EUV light generation controller 5.

The EUV light generation controller 5 may be coupled to each of an exposure unit controller 6a, the target sensor 4, and the target feeder 26.

[3.1.2 Operation]

The EUV light generation controller 5 may receive an EUV light output instruction from the exposure unit controller 6a. The EUV light output instruction may include a repetition frequency setting signal S1. The EUV light generation controller 5 may drive the target feeder 26 to output the target 27. In this case, the master trigger generator 50 of the EUV light generation controller 5 may transmit, to the target feeder 26, the piezoelectric drive signal S3 based on the repetition frequency setting signal S1 to output the target 27 at a repetition frequency designated by the repetition frequency setting signal S1.

The target 27 outputted from the target feeder 26 may be detected by the target sensor 4. The target sensor 4 may output the target detection signal S2 to the EUV light generation controller 5 every time the target sensor 4 detects the target 27.

The EUV light generation controller 5 may transmit a laser output instruction S4 to the laser controller 51. As the laser output instruction S4, a predetermined delay time t5 may be added to the target detection signal S2.

The laser controller 51 may supply, to the QCL controller 52, QCL oscillation information M1 to M4 synchronized with the laser output instruction S4. The QCL controller 52 may supply the QCL oscillation information M1 to M4, respectively, to the QCL 91 to the QCL 94 to allow the QCL 91 to the QCL 94 to oscillate at a timing based on the laser output instruction S4. In this case, the QCL 91 to the QCL 94 may output beams of the laser light of wavelengths different from one another. Only the laser light of a wavelength included in the amplification wavelength region of the amplification medium containing a $CO_2$ gas, among the beams of the laser light oscillated by the QCL 91 to the QCL 94, may be amplified by the regenerative amplifier 200 and the amplifiers PA1 to PA4 in subsequent stages. The timing at which each of the QCL 91 to the QCL 94 outputs the laser light of the wavelength included in the amplification wavelength region may have delay time that differs individually from the oscillation timing. Accordingly, the QCL oscillation information M1 to M4 may have different information on respective oscillation timings to be supplied to the QCL 91 to the QCL 94, in order for each of the QCL 91 to the QCL 94 to output, substantially simultaneously, the laser light of the wavelength included in the amplification wavelength region. The information on the oscillation timing may include current pulse delay data.

The QCL oscillation information M1 to M4 may include data of a plurality of oscillation parameters. The plurality of oscillation parameters may include information on a current pulse delay time t4 and a current waveform of the pulse-like supplied current to the QCL 91 to the QCL 94 described later. The plurality of oscillation parameters may further include information on respective device temperatures of the QCL 91 to the QCL 94. For example, the QCL oscillation information M1 to M4 may include, as the data of the plurality of oscillation parameters, a laser delay time tm corresponding to each of the QCL 91 to the QCL 94, temperature data indicating the device temperatures, current amplitude data, current pulse width data, the current pulse delay data indicating the current pulse delay time t4, and current pulse cycle data. The current pulse cycle data may be data of a repetition cycle of the pulse-like supplied current. The QCL oscillation information M1 to M4 may be associated with respective pieces of ID information on the QCL 91 to the QCL 94. The ID information may also be included in the QCL oscillation information M1 to M4.

The optical multiplexer 111 may allow the optical paths of the beams of the laser light outputted from the respective QCLs, i.e., the QCL 91 to the QCL 94 to substantially coincide with one another to output the respective beams of the laser light.

The laser controller 51 may drive the first Pockels cell 71 of the first optical isolator 81 to transmit the laser light outputted from the optical multiplexer 111. At this time, the driving timing of the first Pockels cell 71 may be determined on the basis of the laser output instruction S4. The laser light that has traveled through the first optical isolator 81 may be inputted to the regenerative amplifier 200.

The laser controller 51 may drive the third and fourth Pockels cells 73 and 74 to cause the laser light to undergo regenerative amplification in the regenerative amplifier 200. At this time, the driving timings of the third and fourth Pockels cells 73 and 74 may be determined on the basis of the laser output instruction S4.

The laser controller 51 may drive the second Pockels cell 72 of the second optical isolator 82 to transmit the laser light outputted from the regenerative amplifier 200. At this time, the driving timing of the second Pockels cell 72 may be determined on the basis of the laser output instruction S4. The laser light that has been traveled through the second optical isolator 82 may be inputted to the amplifier PA1.

The laser controller 51 may transmit RF current instruction signals S11 to S14, respectively, to the RF power sources 121 to 124. The RF power sources 121 to 124 may supply discharge currents, respectively, to the amplifiers PA1 to PA4. The discharge currents may be supplied on the basis of the corresponding RF current instruction signals S11 to S14. The RF current instruction signals S11 to S14 may be based on the laser output instruction S4. For example, the RF current instruction signals S11 to S14 may be determined and outputted every time the laser output instruction S4 is inputted. The discharge current may be determined on the basis of output energy of the laser apparatus 3. The output energy of the laser apparatus 3 may be obtained from an unillustrated laser energy monitor. Further, the laser output instruction S4 may include information that designates a discharge current to be supplied to the amplifiers PA1 to PA4. The amplifiers PA1 to PA4 may sequentially amplify the laser light outputted from the second optical isolator 82, and may output the sequentially amplified laser light.

The laser light outputted from the laser apparatus 3 may travel through the laser light traveling direction controller 34, and may enter, as the pulsed laser light 32, the chamber 2 after passing through the window 21. The laser light that has entered the chamber 2 may be applied to the target 27 that has been supplied into the chamber 2. This may generate the EUV light 251.

[3.2 Description of Regenerative Amplifier]
[3.2.1 Configuration]

Figure 3:
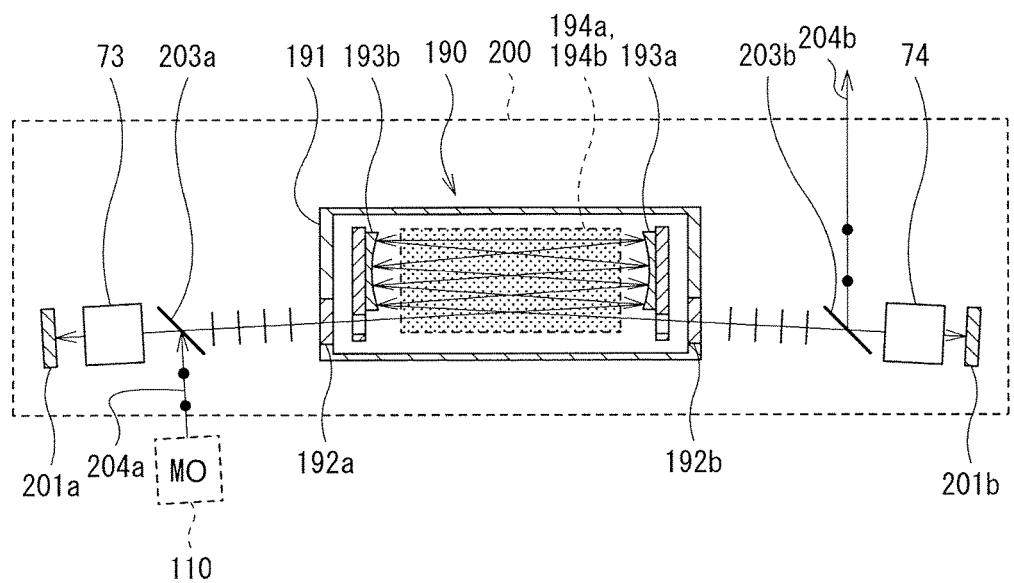
FIG. 3 schematically illustrates a configuration example of a regenerative amplifier.

FIG. 3 schematically illustrates a configuration example of the regenerative amplifier 200. Note that, in FIG. 3, a black dot provided on the optical path may indicate a polarization direction perpendicular to the paper surface, and a solid line that is so provided on the optical path as to be orthogonal to the optical path may indicate a polarization direction parallel to the paper surface.

The regenerative amplifier 200 may include the amplifier 190, the first and second resonator mirrors 201a and 201b, the third and fourth Pockels cells 73 and 74, and first and second polarizers 203a and 203b. The regenerative amplifier 200 may include unillustrated power sources that apply respective potentials to the third and fourth Pockels cells 73 and 74. The power sources that apply the respective potentials to the third and fourth Pockels cells 73 and 74 may be coupled to the laser controller 51 in FIG. 2A.

The amplifier 190 may be a three-axis orthogonal amplifier or any other amplifier besides a slab amplifier. FIG. 3 illustrates a slab amplifier as the amplifier 190. The amplifier 190 may include an amplification chamber 191, first and second concave mirrors 193a and 193b, first and second windows 192a and 192b, and a pair of electrodes 194a and 194b. The pair of electrodes 194a and 194b may be coupled to the RF power source 120 illustrated in FIG. 2A.

The first and second concave mirrors 193a and 193b may be provided in the laser optical path between the first window 192a and the second window 192b. The first and second concave mirrors 193a and 193b may reflect the laser light inside the amplification chamber 191. The first and second concave mirrors 193a and 193b may be each a flat mirror. The first and second windows 192a and 192b may be provided on a wall of the amplification chamber 191.

The amplification chamber 191 may contain a $CO_2$ laser gas therein as the laser medium. The pair of electrodes 194a and 194b may be so disposed inside the amplification chamber 191 to be opposed to each other in a direction orthogonal to the paper surface of FIG. 3. The pair of electrodes 194a and 194b and the RF power source 120 illustrated in FIG. 2A may configure an excitation unit that excites the laser medium by the electric discharge generated by the RF voltage. The laser light that has entered the amplification chamber 191 may be amplified at the time of passing through the excited laser medium.

In the regenerative amplifier 200, the first and second resonator mirrors 201a and 201b may configure a resonator. The third and fourth Pockels cells 73 and 74, the first and second polarizers 203a and 203b, and the amplifier 190 may be disposed in the optical path between the first resonator mirror 201a and the second resonator mirror and 201b.

[3.2.2 Operation]

The regenerative amplifier 200 may apply a potential by an unillustrated power source to operate the third Pockels cell 73. The MO 110 may output laser light of a polarization direction perpendicular to the paper surface of FIG. 3 as seed light 204a, for example. The laser light outputted from the MO 110 may be reflected by the first polarizer 203a, and the reflected laser light may travel through the third Pockels cell 73 supplied with a potential. The laser light may be reflected by the first polarizer 203a. The reflected laser light may enter the third Pockels cell 73, and may travel through the third Pockels cell 73, thereby being converted into circular polarized light. Thereafter, the circular-polarized laser light may be reflected by the first resonator mirror 201a, and the reflected laser light may travel through the third Pockels cell 73 again to be converted into polarized light of a direction parallel to the paper surface of FIG. 3.

After the laser light travels through the third Pockels cell 73 again, the unillustrated power source for the third Pockels cell 73 may be turned off. The laser light that has traveled through the third Pockels cell 73 again may travel through the first polarizer 203a, and then may enter the amplifier 190 through the first window 192a. The laser light that has entered the amplifier 190 may be reflected multiple times between the first and second concave mirrors 193a and 193b to be amplified inside the amplification chamber 191, and the amplified laser light may be outputted through the second window 192b.

The laser light outputted through the second window 192b may travel through the second polarizer 203b at high transmittance, and may travel through the fourth Pockels cell 74 to which a potential is not applied by the unillustrated power source. The laser light that has traveled through the fourth Pockels cell 74 may be reflected by the second resonator mirror 201b. The reflected laser light may travel through the fourth Pockels cell 74 and the second polarizer 203b again at high transmittance while being polarized in a direction parallel to the paper surface. Thereafter, the laser light may enter the amplifier 190 again through the second window 192b. The laser light that has entered the amplifier 190 may be amplified in the amplification chamber 191 by being reflected multiple times between the first and second concave mirrors 193a and 193b. Thereafter, the amplified laser light may be outputted through the first window 192a. The laser light outputted through the first window 192a may travel through the first polarizer 203a and the third Pockels cell 73 at high transmittance, and thereafter may be reflected by the first resonator mirror 201a. The reflected laser light may travel through the third Pockels cell 73 and the first polarizer 203a again at high transmittance.

Through repetition of the foregoing example processes, the laser light may reciprocate in the resonator between the first resonator mirror 201a and the second resonator mirror 201b, thereby being amplified. When the regenerative amplified light by the resonator is to be outputted to the outside, the unillustrated power source for the fourth Pockels cell 74 may be turned on. This may convert the laser light polarized in a direction parallel to the paper surface into laser light polarized in a direction perpendicular to the paper surface, and the regenerative amplified light may be reflected by the second polarizer 203b at high reflectance to be outputted as the amplified laser light 204b to the outside.

[3.3 Issues of Laser Apparatus Including QCL]

[3.3.1 Description of Key Part of Laser Apparatus Including QCL]

Figure 4:
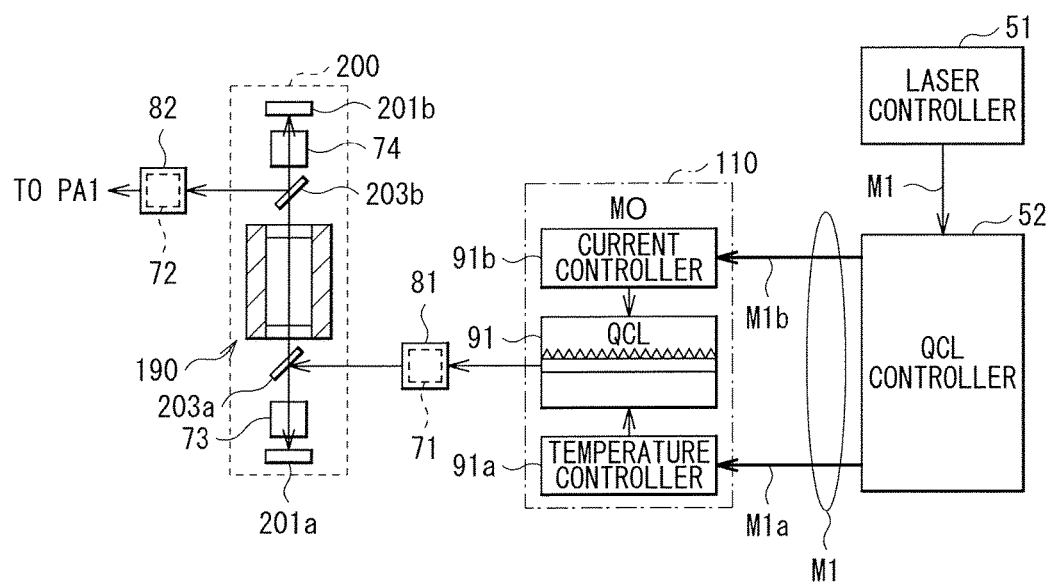
FIG. 4 schematically illustrates a configuration example of a key part of the laser apparatus including the QCL.
Figure 5:
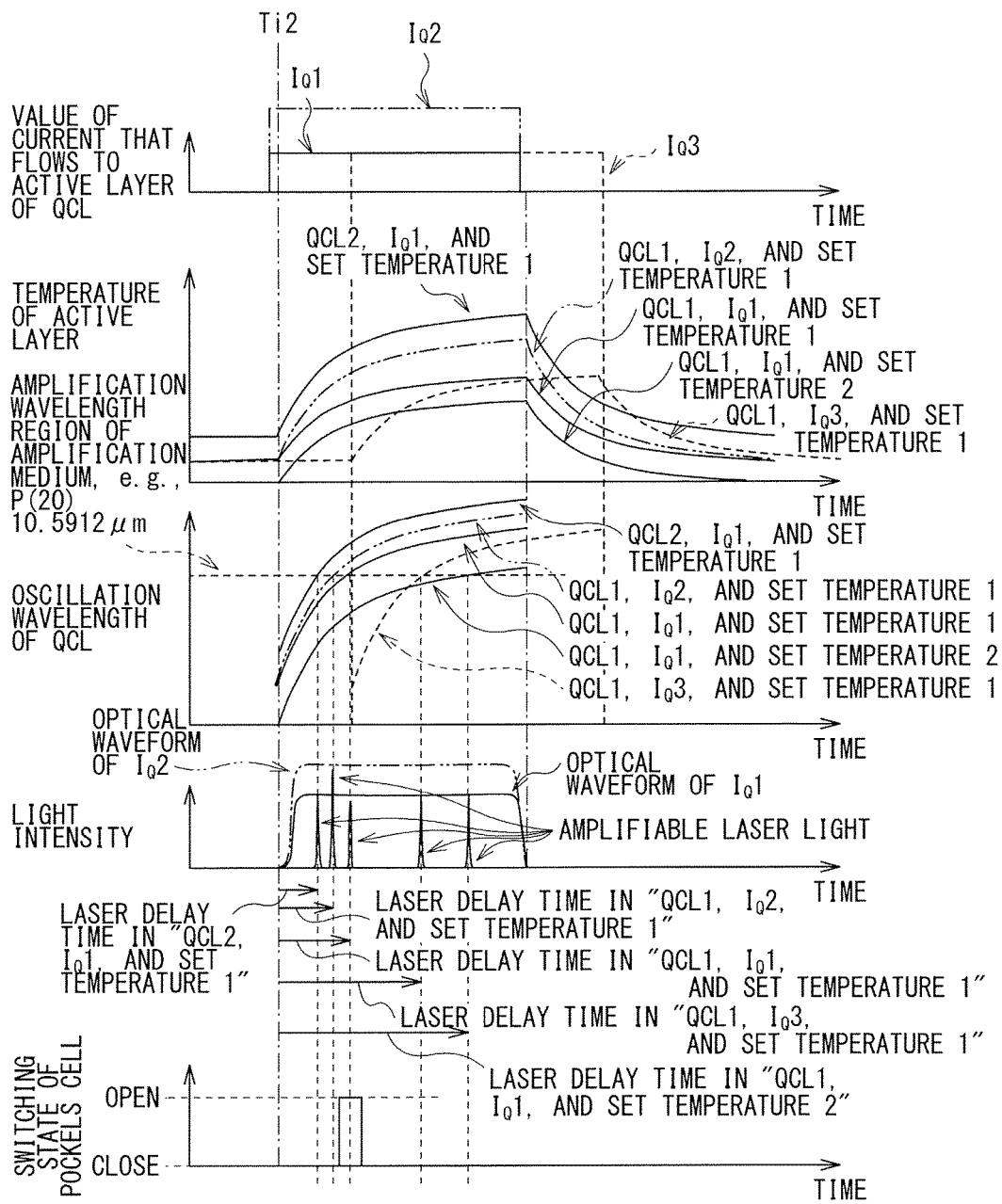
FIG. 5 is a timing chart that describes a laser delay time in the QCL.
Figure 6:
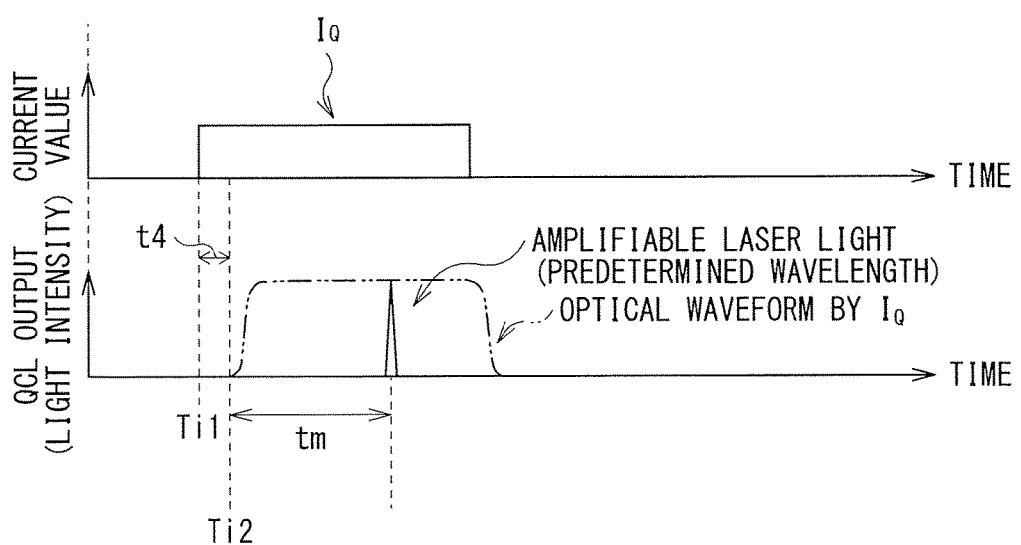
FIG. 6 is a timing chart that describes a laser delay time in the QCL.

FIG. 4 schematically illustrates a configuration example of a key part of the laser apparatus 3 including the QCL 91. Each of FIG. 5 and FIG. 6 is a timing chart that describes the laser delay time tm in the QCL 91.

The MO 110 may include a temperature controller 91a and a current controller 91b. The temperature controller 91a may control a temperature of the QCL 91. The current controller 91b may control a supplied current to the QCL 91. The temperature controller 91a and the current controller 91b may be each coupled to the QCL controller 52. The temperature controller 91a may control the temperature of the QCL 91 on the basis of temperature data M1a outputted from the QCL controller 52. The current controller 91b may control the supplied current to the QCL 91 on the basis of QCL oscillation information M1b outputted from the QCL controller 52. The QCL oscillation information M1b excludes the temperature data M1a.

The QCL controller 52 may receive the QCL oscillation information M1 from the laser controller 51. The QCL controller 52 may control the temperature controller 91a and the current controller 91b to oscillate the QCL 91 at the timing based on the laser output instruction S4 supplied from the EUV light generation controller 5 illustrated in FIG. 2A. Only the laser light of the wavelength included in the amplification wavelength region of the amplification medium containing a $CO_2$ gas, among beams of the laser light outputted by the oscillation of the QCL 91, may be amplified by the regenerative amplifier 200 and the amplifiers PA1 to PA4 in the subsequent stages. The amplification wavelength region may be P(20) 10.5912 μm, as illustrated in FIG. 5, for example.

An oscillation wavelength of the QCL 91 may depend on a length of an optical path of a resonator of the QCL 91 and on a selected wavelength of a grating of the QCL 91. When a temperature of an active layer of the QCL 91 varies, refractive indexes of the active layer and the grating may vary, and a grating frequency and a resonator length of the QCL 91 may also vary. Accordingly, when the temperature of the QCL 91 varies, the oscillation wavelength may vary.

The temperature controller 91a may include a Peltier device. There may be a case where the temperature of the QCL 91 is controlled to be kept constant by cooling or heating the QCL 91 with the Peltier device of the temperature controller 91a. However, allowing a current pulse $I_Q$ to flow to the QCL 91 may cause a phenomenon where the temperature of the active layer varies transitionally. Note that the current pulse may be supplied through the QCL oscillation information M1.

At the time of rising of the current pulse $I_Q$ when a current starts flowing to the QCL 91 and at its initial stage, the temperature of the active layer of a semiconductor may rise sharply due to electric resistance inside the QCL 91 and due to heat generation as a result of factors such as light absorption inside the QCL 91. As time elapses thereafter, the rise of the temperature may become milder. After falling edge of the current pulse 1Q at which the current stops, the temperature of the active layer may be lowered, and, as time elapses, may be asymptotically closer to a temperature determined by cooling with the Peltier device and a load state of the QCL 91.

When the temperature of the active layer is increased, the refractive indexes of the active layer and the grating may be increased, thus increasing the length of the optical path of the resonator. As a result, a center wavelength of the laser light outputted from the QCL 91 may vary in a similar manner to the variation in the temperature of the active layer. This phenomenon may be referred to as wavelength chirping.

The QCL 91 may cause the wavelength chirping, whereas the amplifiers in the subsequent stages, such as the regenerative amplifier 200 and the amplifier PA1 may use $CO_2$ as a medium, and thus an amplifiable wavelength may be the predetermined wavelength. Therefore, at a timing at which the variable wavelength overlaps the predetermined wavelength, only the laser light outputted from the QCL 91 may be amplified. The predetermined wavelength may be amplifiable with an amplifier such as the regenerative amplifier 200 and the amplifier PA1. Accordingly, as illustrated in FIG. 5 and FIG. 6, the laser delay time tm may occur during a time period from an oscillation start timing Ti2 of the QCL 91 to a time point at which the predetermined wavelength is obtained.

FIG. 6 illustrates a timing chart indicating variation in a current value of the supplied current to the QCL 91 and a timing chart indicating variation in a wavelength of the laser light outputted from the QCL 91. In each of the timing charts illustrated in FIG. 6, the horizontal axis may indicate time. In the timing chart indicating the variation in the current value of the supplied current, the vertical axis may indicate a current value. In the timing chart indicating the variation in the wavelength of the laser light, the vertical axis may indicate light intensity.

The current pulse $I_Q$ may be supplied as the supplied current to the QCL 91. As illustrated in FIG. 6, the QCL 91 may start oscillating the laser light at the oscillation start timing Ti2 at which the current pulse delay time t4 elapses from a current rising timing Ti1 of the current pulse $I_Q$. At a timing at which the laser delay time tm elapses from the oscillation start timing Ti2, the wavelength of the laser light may be equal to the predetermined wavelength amplifiable with an amplifier such as the regenerative amplifier 200.

The laser delay time tm may fluctuate depending on factors such as individual characteristics of the QCL 91, the load state of the QCL 91, and a waveform of the current pulse $I_Q$.

FIG. 5 illustrates various timing charts in cases where the QCL 91 is caused to oscillate in multiple conditions. In each of the timing charts illustrated in FIG. 5, the horizontal axis may indicate time. FIG. 5 illustrates a timing chart indicating variation in the value of a current that flows to the active layer of the QCL 91, a timing chart indicating variation in the temperature of the active layer of the QCL 91, and a timing chart indicating variation in the oscillation wavelength of the QCL 91. FIG. 5 further illustrates a timing chart indicating variation in the light intensity of the laser light to be amplified with an amplifier such as the regenerative amplifier 200 and the amplifier PA1, and a timing chart indicating variation in a switching state of each of the first and second Pockels cells 71 and 72.

FIG. 5 may illustrate, as conditions of the current pulse $I_Q$ to be supplied to the QCL 91, current pulses $I_Q1$ and $I_Q3$ both having small current amplitude and a current pulse $I_Q2$ having large current amplitude as compared with the current pulses $I_Q1$. The current pulse $I_Q3$ may indicate an example of the current pulse $I_Q$ to be supplied at a delayed timing as compared with the current pulses $I_Q1$ and $I_Q2$.

FIG. 5 may illustrate the respective characteristics of combinations of a condition of the above-described three types of current pulses $I_{Q1}$, $I_{Q2}$, and $I_{Q3}$, a condition of the temperature of the active layer, and a condition of the individual characteristics of the QCL 91, in a comparative manner when the conditions are combined. The conditions of the temperature of the active layer may be two set temperatures 1 and 2. The conditions of the individual characteristics may be QCLs 1 and 2 that have different individual characteristics.

For example, the current pulse $I_Q1$ having small current amplitude and the current pulse $I_Q2$ having large current amplitude are compared with each other. For example, the condition of "QCL1, $I_Q1$, and set temperature 1" and the condition of "QCL1, $I_Q2$, and set temperature 1" in FIG. 5 are compared with each other. In a case where the current amplitude is large, a heat load of the QCL 91 is increased with increase of an electric load, thus increasing heat generation amount. As a result, the temperature of the active layer may be increased, as compared with the temperature of the active layer in a case where the current amplitude is small.

With the increased temperature of the active layer, the laser light from the QCL 91 may undergo large wavelength chirping. As a result, the laser light from the QCL 91 may reach the predetermined wavelength amplifiable with the amplifier at an early timing, as compared with the case where the current amplitude is small. For example, in FIG. 5, when the laser delay time tm in the case of "QCL1, $I_Q1$, and set temperature 1" and the laser delay time tm in the case of "QCL1, $I_Q2$, and set temperature 1" are compared with each other, the laser delay time tm under the condition of "QCL1, $I_Q2$, and set temperature 1" may be shorter time.

For example, when the current is supplied to the QCL 91 in a delayed manner as observed in the current pulse $I_Q3$, the wavelength and the temperature of the active layer may vary in a delayed manner, as compared with, for example, a case where the current is supplied earlier as observed in the current pulse $I_Q1$. For example, in FIG. 5, the wavelength and the temperature of the active layer may vary in a delayed manner in a case of a condition of "QCL1, $I_Q3$, and set temperature 1", as compared with the case of the condition of "QCL1, $I_Q1$, and set temperature 1". As a result, the wavelength in the case of the condition of "QCL1, $I_Q3$, and set temperature 1" may reach, at a delayed timing, the predetermined wavelength amplifiable with the amplifier, as compared with the case where the current is supplied earlier.

In a case where a different individual piece of the QCL 91 is adopted, for example, even when the QCL 91 having the same current waveform is set to have the same environment temperature using the temperature controller 91a, wavelength chirping characteristics may vary. This is because the temperature of the active layer of the QCL 91 varies for each individual piece. As a result, the individual piece of the QCL 91 may reach the predetermined wavelength amplifiable with the amplifier at a timing different from that of another individual piece of the QCL 91. For example, the laser delay time tm in the case of "QCL1, $I_Q1$, and set temperature 1" and the laser delay time tm in the case of "QCL2, $I_Q1$, and set temperature 1" may differ from each other, in FIG. 5, for example.

[3.3.2 Issues]

As described above, in the EUV light generating apparatus 1, it may be necessary to synchronize a target reaching timing Ts0 with a timing at which the laser light of the predetermined wavelength is outputted from the QCL 91. The target 27 may reach the plasma generation region 25 at the target reaching timing Ts0. The laser light of the predetermined wavelength may be amplifiable with an amplifier such as the regenerative amplifier 200. Further, it may be necessary to synchronize the driving timings of the regenerative amplifier 200 and the first to fourth Pockels cells 71 to 74 with the timing at which the laser light of the predetermined wavelength is outputted from the QCL 91.

Therefore, there may be a case where the timing at which the laser light of the predetermined wavelength is outputted from the QCL 91 and the driving timings of the first to fourth Pockels cells 71 to 74 are out of synchronization with each other, thus resulting in the laser light not being amplified, in situations where the individual piece of the QCL 91 is varied and where the QCL oscillation information M1 is varied. Further, there may be a case where the laser light is not applied to the target 27 in similar situations.

4. First Embodiment

Description is given next of a laser apparatus according to a first embodiment of the present disclosure. The embodiment is applicable, for example, to the laser apparatus 3 in the EUV light generating system 11 illustrated in FIG. 1.

[4.1 Laser Apparatus]

[4.1.1 Configuration]

Figure 7:
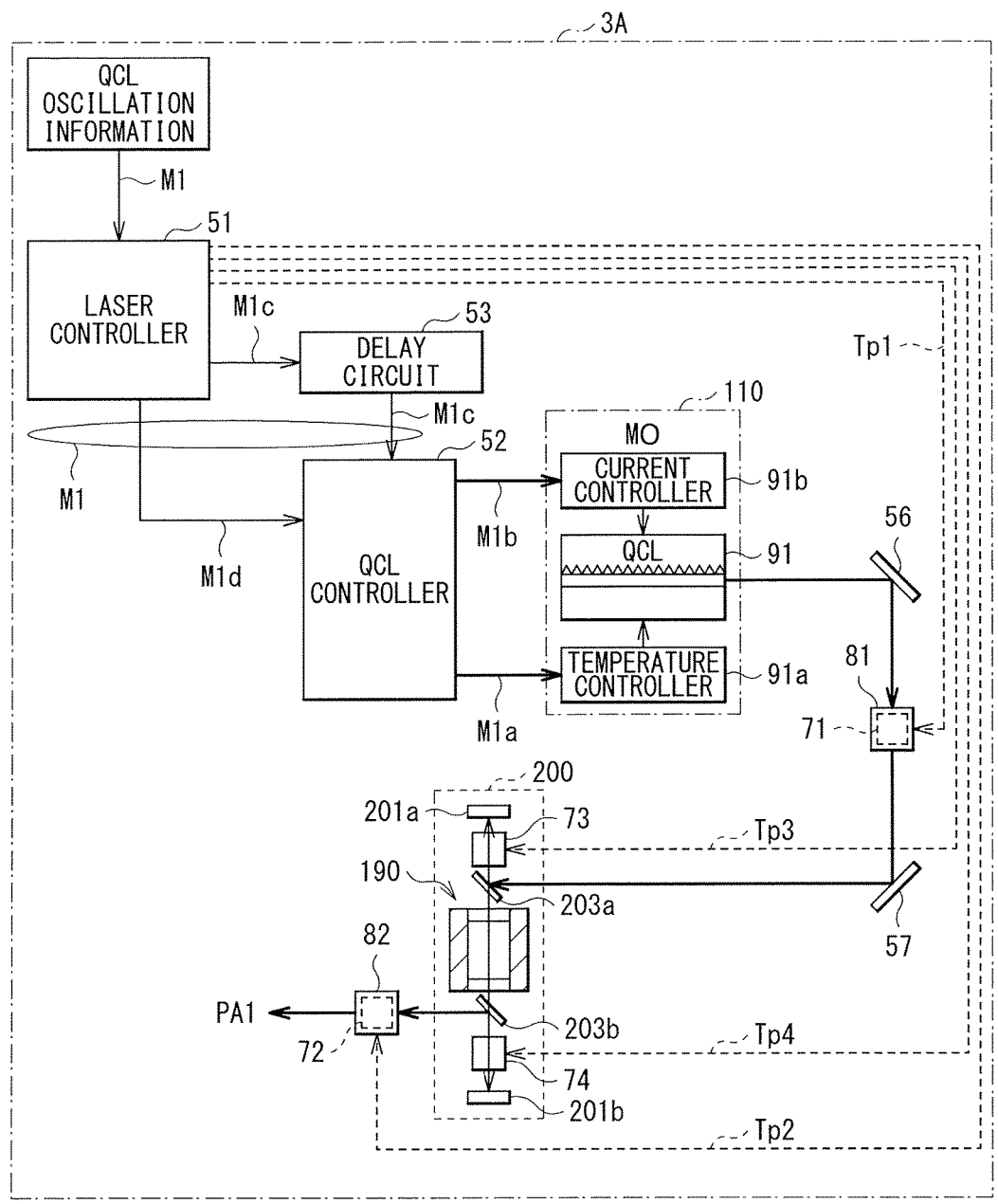
FIG. 7 schematically illustrates a configuration example of a laser apparatus according to a first embodiment.

FIG. 7 schematically illustrates a configuration example of a laser apparatus 3A according to the first embodiment of the present disclosure. The laser apparatus 3A according to the embodiment may include a delay circuit 53. The delay circuit 53 may be coupled to the laser controller 51 and the QCL controller 52. The laser apparatus 3A may further include a reflection mirror 56 and a reflection mirror 57. The reflection mirror 56 and the reflection mirror 57 may be so disposed in the optical path of the laser light as to guide the laser light outputted from the MO 110 to the regenerative amplifier 200. The first optical isolator 81 may be disposed in the optical path between the reflection mirror 56 and the reflection mirror 57.

The laser controller 51 may control the oscillation of the QCL 91 to allow the wavelength of the laser light to be equal to the predetermined wavelength at an aimed timing Ta. The aimed timing Ta may be a timing determined on the basis of an operation timing of the optical shutter. The optical shutter may be one or more of the first to fourth Pockels cells 71 to 74. Further, the aimed timing Ta may be a timing determined on the basis of the timing at which the laser light is applied to the target 27 that is supplied to the chamber 2.

Other configurations may be substantially similar to those of the laser apparatus 3 illustrated in FIG. 2A and FIG. 4.

[4.1.2 Operation]

Figure 8:
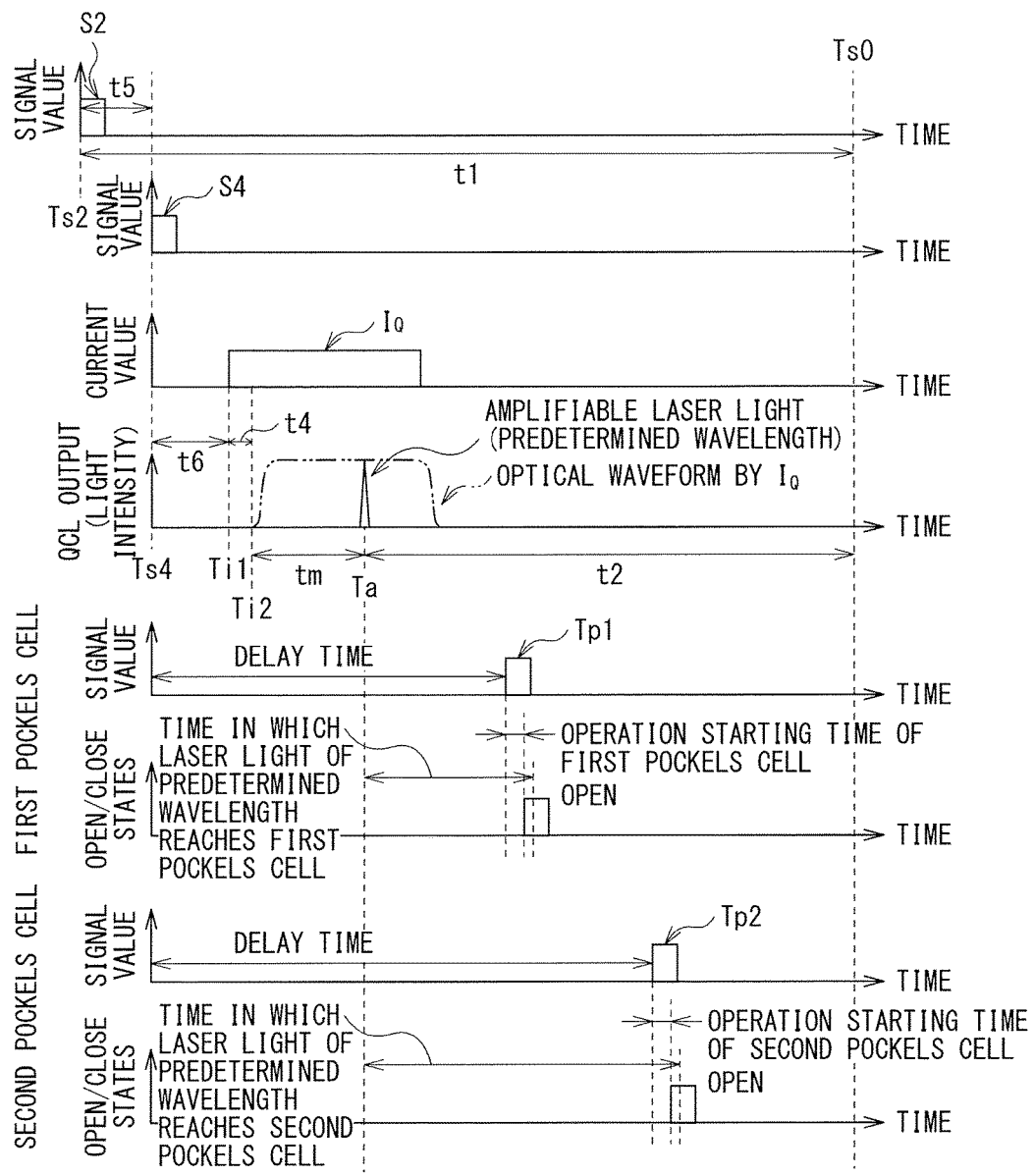
FIG. 8 is a timing chart that describes operation timings of respective sections.
Figure 9:
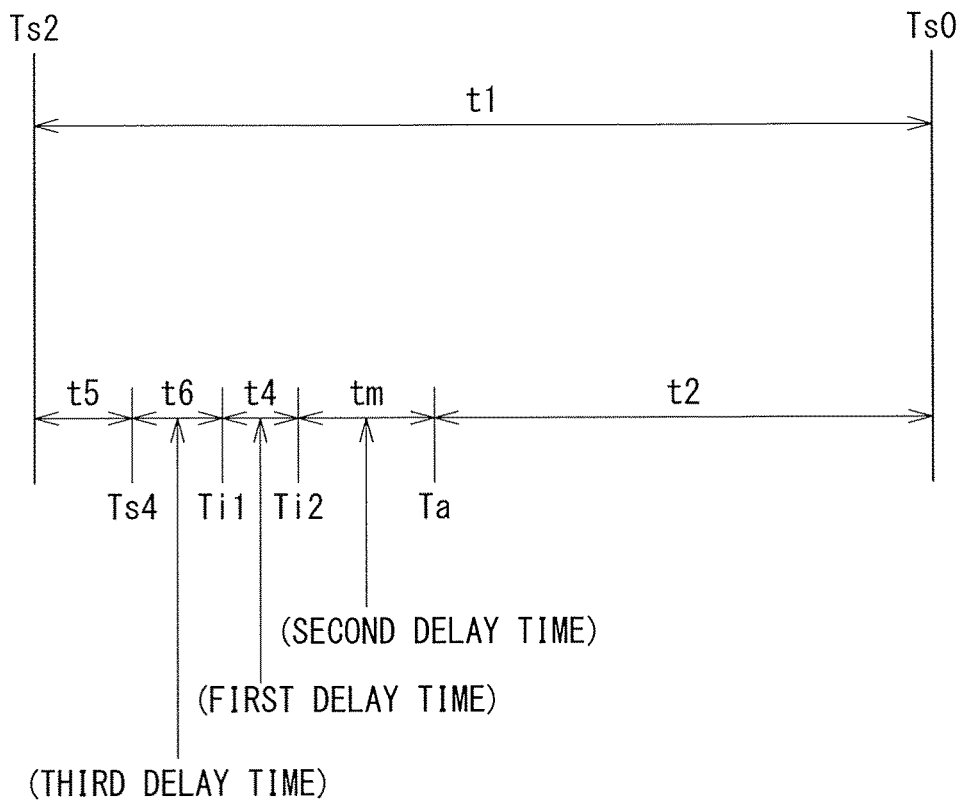
FIG. 9 is a timing chart illustrating a part of the operation timing in FIG. 8 in a simplified manner.
Figure 10:
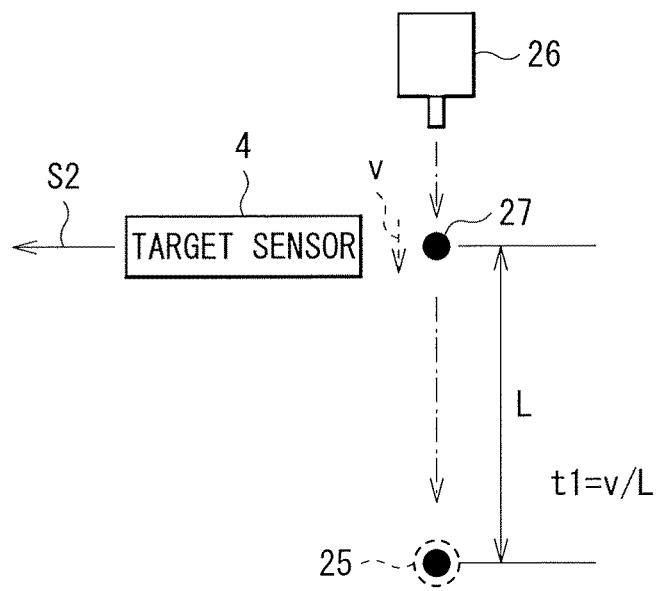
FIG. 10 illustrates a time period from detection of a target to reaching a plasma generation region.

Description is given first of the QCL 91 to be controlled by the laser controller 51 and the operation timing of the optical shutter with reference to FIG. 8 to FIG. 10. FIG. 8 is a timing chart that describes operation timings of respective sections. FIG. 9 is a timing chart illustrating a part of the operation timings in FIG. 8 in a simplified manner. FIG. 10 illustrates a time period from detection of the target 27 by the target sensor 4 to reaching the plasma generation region 25.

FIG. 8 illustrates a timing chart of the target detection signal S2, a timing chart of the laser output instruction S4, a timing chart indicating the variation in the current value of the supplied current to the QCL 91, and a timing chart indicating the variation in the wavelength of the laser light outputted from the QCL 91. FIG. 8 further illustrates, as an example of the operation timing of the optical shutter, timing charts of Pockels cell timing signals Tp1 and Tp2 of the respective first and second Pockels cells 71 and 72 and open/close states of the first and second Pockels cells 71 and 72. Note that in each of the timing charts illustrated in FIG. 8, the horizontal axis may indicate time. In the timing charts of the target detection signal S2 and the laser output instruction S4, the vertical axis may indicate a signal value. In the timing chart indicating the variation in the current value of the supplied current, the vertical axis may indicate a current value. In the timing chart indicating the variation in the wavelength of the laser light, the vertical axis may indicate light intensity. In the timing charts of the Pockels cell timing signals Tp1 and Tp2 of the respective first and second Pockels cells 71 and 72, the vertical axis may indicate a signal value. In the timing charts of the open/close states of the first and second Pockels cells 71 and 72, the vertical axis may indicate the open/close state.

A time period from a target detection timing Ts2 to the target reaching timing Ts0 may be t1. The target detection timing Ts2 may be a timing at which detection is made by the target sensor 4. The target reaching timing Ts0 may be a timing at which the target 27 reaches the plasma generation region 25. As illustrated in FIG. 10, the time t1 may be represented by the following expression:

$$t1 = v/L$$

where L denotes a distance from a detected position of the target 27 to the plasma generation region 25, and v denotes a speed of the target 27.

An output timing Ts4 of the laser output instruction S4 may be determined on the basis of the target detection timing Ts2. The laser output instruction S4, i.e., the target detection signal S2 with the predetermined delay time t5 being added thereto may be outputted from the EUV light generation controller 5 to the laser controller 51.

The current pulse $I_Q$ may be supplied as the supplied current to the QCL 91. In the QCL 91, the oscillation of the laser light may be started at the oscillation start timing Ti2 at which the current pulse delay time t4 elapses from the current rising timing Ti1 of the current pulse $I_Q$. At the aimed timing Ta at which the laser delay time tm elapses from the oscillation start timing Ti2, the wavelength of the laser light may be equal to the predetermined wavelength amplifiable with an amplifier such as the regenerative amplifier 200.

The laser controller 51 may control, on the basis of the QCL oscillation information M1, delay time t6 from the output timing Ts4 of the laser output instruction S4 to the current rising timing Ti1. The control by the laser controller 51 may be performed to allow the wavelength of the laser light to be equal to the predetermined wavelength at the aimed timing Ta at which the laser delay time tm elapses from the oscillation start timing Ti2.

The aimed timing Ta may be determined on the basis of time t2 and the target reaching timing Ts0. The time t2 may be a time period from the output of the laser light of the predetermined wavelength from the QCL 91 to reaching the plasma generation region 25.

Note that a first delay time in an embodiment of the present disclosure may be the current pulse delay time t4 from the current rising timing Ti1 of the current pulse $I_Q$ to the oscillation start timing Ti2 of the laser light, as illustrated in FIG. 9. The current pulse delay time t4 may be a value specific to each piece of the QCL 91. A second delay time in an embodiment of the present disclosure may be the laser delay time tm from the oscillation start timing Ti2 of the laser light to a timing at which the wavelength of the laser light is equal to the predetermined wavelength amplifiable with an amplifier such as the regenerative amplifier 200. A third delay time in an embodiment of the present disclosure may be the delay time t6 from the output timing Ts4 of the laser output instruction S4 to the current rising timing Ti1.

The laser controller 51 may transmit, to the first and second Pockels cells 71 and 72, the Pockels cell timing signals Tp1 and Tp2 in which a predetermined delay time is added to the output timing Ts4 of the laser output instruction S4. The first Pockels cell 71 may be brought into an open state at a timing at which an operation start delay time elapses from rising of the Pockels cell timing signals Tp1. This may bring the first Pockels cell 71 into the open state at a timing at which the laser light of the predetermined wavelength reaches the first Pockels cell 71. The second Pockels cell 72 may be brought into an open state at a timing at which the operation start delay time elapses from rising of the Pockels cell timing signals Tp2. This may bring the second Pockels cell 72 into the open state at a timing at which the laser light of the predetermined wavelength reaches the second Pockels cell 72.

Figure 11:
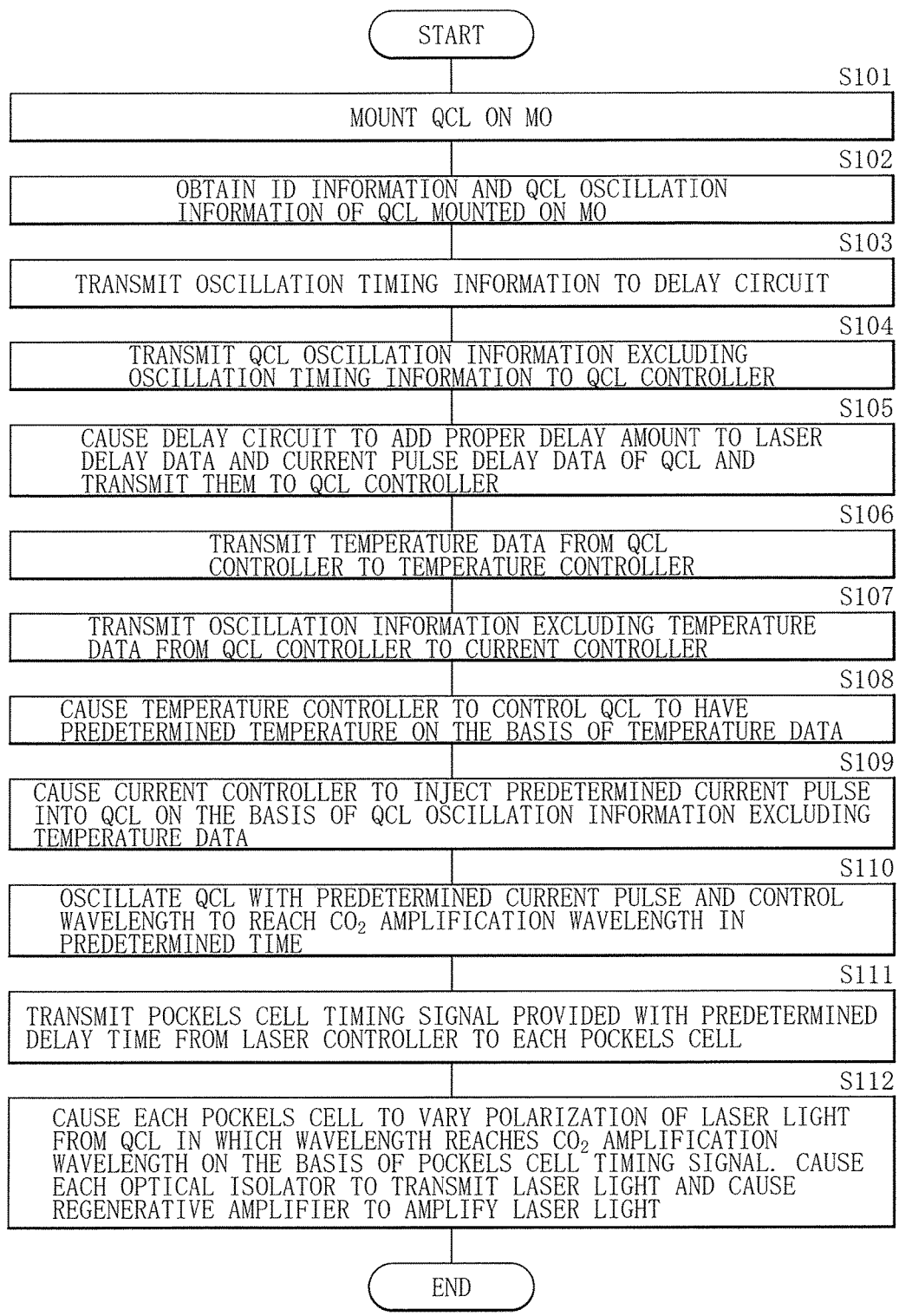
FIG. 11 is a flowchart illustrating an example of an operation of the laser apparatus illustrated in FIG. 7.

FIG. 11 is a flowchart illustrating an example of an operation of the laser apparatus 3A.

The QCL 91 may be first mounted on the MO 110 (Step S101). The mounting of the QCL 91 may be detected through surveillance, by the laser controller 51, of a coupling state of an unillustrated signal line that is coupled to the QCL 91. Alternatively, a proximity switch, for example, may be used to detect whether the QCL 91 is mounted.

Next, the laser controller 51 may obtain ID information and the QCL oscillation information M1 of the QCL 91 mounted on the MO 110 (Step S102). The laser controller 51 may obtain the ID information and the QCL oscillation information M1 from unillustrated database coupled to the laser controller 51. Alternatively, the laser controller 51 may obtain the ID information and the QCL oscillation information M1 through an input by an operator via an unillustrated console. During the input by the operator, a portable storage medium may be used. Alternatively, the ID information and the QCL oscillation information M1 may be inputted to the laser controller 51 from an external unit via a wire communication line or a wireless communication line.

Next, the laser controller 51 may transmit oscillation timing information M1c to the delay circuit 53 on the basis of the QCL oscillation information M1 (Step S103). The oscillation timing information M1c may include laser delay data and the current pulse delay data of the QCL 91 that are included in the QCL oscillation information M1. The timing information on the laser output instruction S4 is reflected in the current pulse delay data.

Next, the laser controller 51 may transmit QCL oscillation information M1d excluding the oscillation timing information M1c to the QCL controller 52 on the basis of the QCL oscillation information M1 (Step S104). Thereafter, the laser controller 51 may cause the delay circuit 53 to add, as the delay time t6, a proper delay amount to the laser delay data and the current pulse delay data of the QCL 91, and may transmit, to the QCL controller 52, the data of the QCL 91 with the delay time t6 being added (Step S105). The laser controller 51 may set the delay circuit 53 to add, as the delay time t6, the proper delay amount to the oscillation timing information M1c of the QCL 91. The QCL controller 52 may receive the oscillation timing information M1c with the delay time t6 being added as the proper delay amount. The temperature data Mia may be transmitted from the QCL controller 52 to the temperature controller 91a on the basis of temperature control information included in the QCL oscillation information M1d (Step S106). Thereafter, the QCL oscillation information M1b excluding the temperature data Mia may be transmitted from the QCL controller 52 to the current controller 91b (Step S107).

Next, the laser controller 51 may cause the temperature controller 91a to control the QCL 91 to have a predetermined temperature on the basis of the temperature data M1a (Step S108). Thereafter, the laser controller 51 may cause the current controller 91b to inject a predetermined current pulse $I_Q$ into the QCL 91 on the basis of the QCL oscillation information M1b excluding the temperature data M1a (Step S109).

Next, the laser controller 51 may cause the current controller 91b to oscillate the QCL 91 with the predetermined current pulse $I_Q$, and to control the wavelength to reach a $CO_2$ amplification wavelength in predetermined time (Step S110). Thereafter, Pockels cell timing signals Tp1 to Tp4 each provided with predetermined delay time may be transmitted, respectively, to the first to fourth Pockels cells 71 to 74 from the laser controller 51 (step S111).

Next, the laser controller 51 may cause the first to fourth Pockels cells 71 to 74 to vary, on the basis of the corresponding Pockels cell timing signals Tp1 to Tp4, polarization of the laser light from the QCL 91 in which the wavelength reaches the $CO_2$ amplification wavelength. The laser controller 51 thus may cause the first and second optical isolators 81 and 82 to transmit the laser light. The laser controller 51 may further cause the regenerative amplifier 200 to amplify the laser light (Step S112). Thereafter, the processing may be completed.

This may control the first and second optical isolators 81 and 82 and the regenerative amplifier 200, in synchronization with a timing at which light of the $CO_2$ amplification wavelength passes through, among wavelengths of beams of the laser light to be outputted from the QCL 91.

The laser light outputted from the QCL 91 may travel through the first optical isolator 81 at an adequate timing, and only the wavelength within the $CO_2$ amplification wavelength region may be amplified in the regenerative amplifier 200. The laser light amplified in the regenerative amplifier 200 may travel through the second optical isolator at an adequate timing to be outputted to the amplifier PA1 in the subsequent stage.

[4.1.3 Workings]

According to the laser apparatus 3A of the embodiment, it is possible to control the oscillation of the QCL 91, on the basis of the QCL oscillation information M1, to allow the wavelength of the laser light to be equal to the predetermined wavelength at the aimed timing Ta. This makes it possible to synchronize the timing at which the laser light is applied to the target 27 with the timing at which the laser light of the predetermined wavelength is outputted from the QCL 91. The predetermined wavelength is amplifiable with an amplifier such as the regenerative amplifier 200.

[4.2 First Example of Measurement Unit]

[4.2.1 Configuration]

Figure 12:
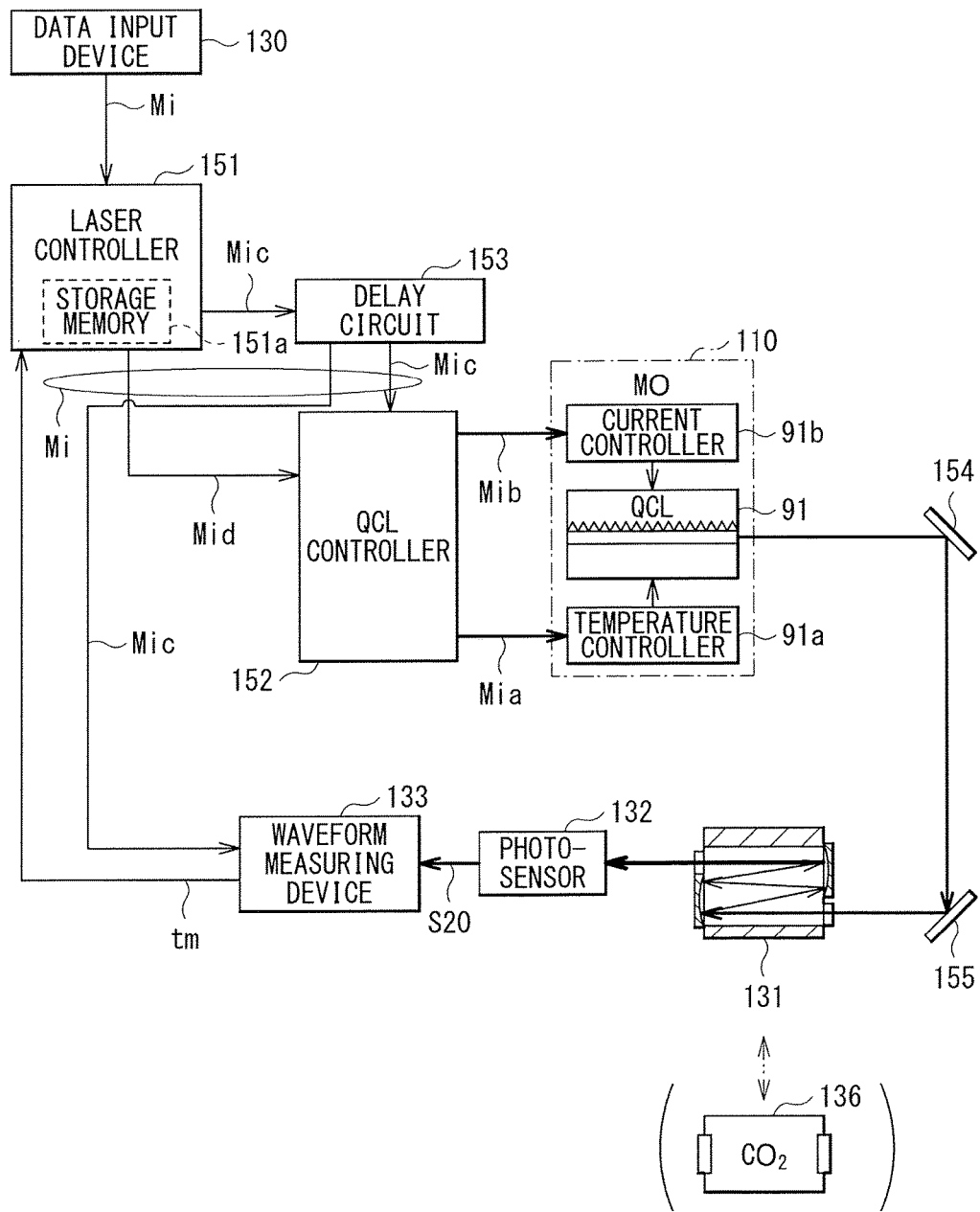
FIG. 12 schematically illustrates a first configuration example of a measurement unit according to the first embodiment.

FIG. 12 schematically illustrates a first configuration example of a measurement unit according to the first embodiment. The measurement unit illustrated in FIG. 12 may be a unit that measures the laser delay data in association with the temperature data and the current amplitude data of the QCL 91, in order to specify the QCL oscillation information M1 for use in the laser apparatus 3A illustrated in FIG. 7.

The measurement unit may include the MO 110, a laser controller 151, a QCL controller 152, and a delay circuit 153. The laser controller 151, the QCL controller 152, and the delay circuit 153 may have substantially similar functions, respectively, as those of the laser controller 51, the QCL controller 52, and the delay circuit 53 illustrated in FIG. 7, except functions related to measurement. The laser controller 151 may include a storage memory 151a.

Further, the measurement unit may include a data input device 130, a $CO_2$ amplifier 131, a photosensor 132, a waveform measuring device 133, a reflection mirror 154, and a reflection mirror 155. The data input device 130 may be coupled to the laser controller 151.

The $CO_2$ amplifier 131 may include a chamber that contains a $CO_2$ gas. The chamber of the $CO_2$ amplifier 131 may be provided with a window through which the laser light passes. The $CO_2$ amplifier 131 may be disposed in the optical path of the laser light outputted from the QCL 91. The reflection mirror 154 and the reflection mirror 155 may be so disposed in the optical path of the laser light as to guide the laser light outputted from the QCL 91 to the $CO_2$ amplifier 131. A $CO_2$ gas cell 136 may be provided instead of the $CO_2$ amplifier 131. The $CO_2$ gas cell 136 may contain a $CO_2$ gas. A gas cell of the $CO_2$ gas cell 136 may be provided with a window through which the laser light passes.

The photosensor 132 may be disposed in the optical path of the laser light that has traveled through the $CO_2$ amplifier 131. The photosensor 132 may be a photodetector that responds to light intensity of the laser light outputted from the QCL 91. For example, PEM-10.6 available from Vigo System S.A. located in Warsaw, Poland may be used as the photosensor 132.

The photosensor 132 may be coupled to the waveform measuring device 133. An oscilloscope, for example, may be used as the waveform measuring device 133. The delay circuit 153 may be coupled to the waveform measuring device 133.

The $CO_2$ amplifier 131, the photosensor 132, and the waveform measuring device 133 may configure a measuring device that measures the laser delay time tm. The laser delay time tm may be a time period from the oscillation start timing Ti2 of the QCL 91 to a timing at which the wavelength of the laser light outputted from the QCL 91 is equal to the predetermined wavelength. The laser controller 151 may be a measurement controller. The measurement controller may control the oscillation of the QCL 91 on the basis of initial QCL oscillation information Mi for measurement. The measurement controller may vary the laser delay time tm by varying one or more of oscillation parameters excluding the current pulse delay time t4, among a plurality of oscillation parameters included in the initial QCL oscillation information Mi. The measurement controller may further output, as specific oscillation information, oscillation information obtained at a timing at which the laser delay time tm reaches a predetermined time.

[4.2.2 Operation]

Figure 13:
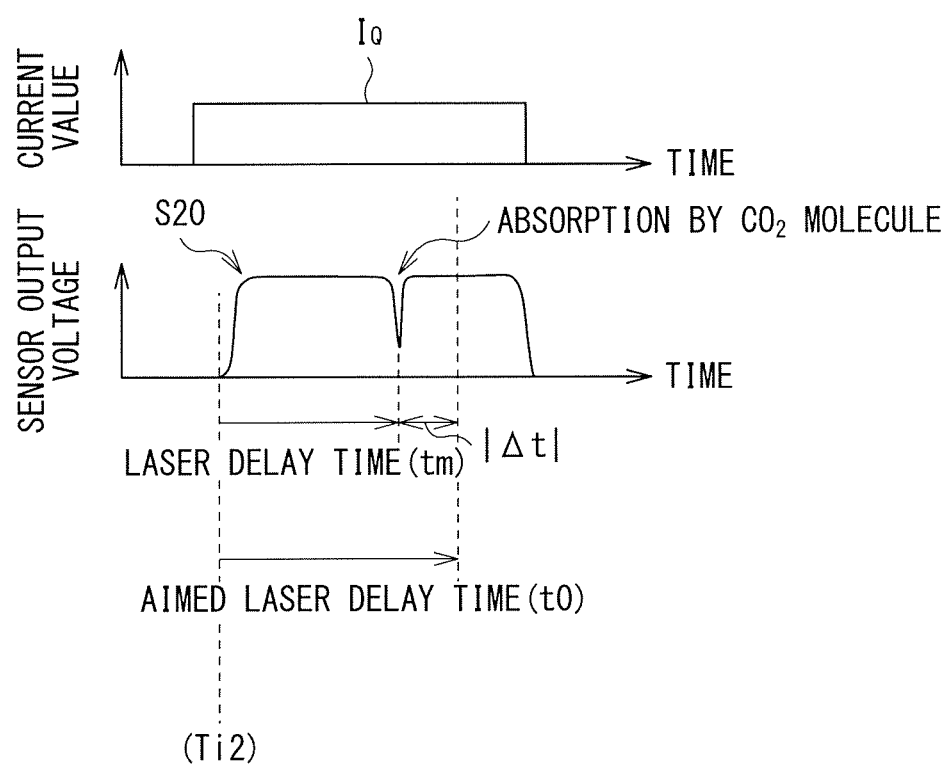
FIG. 13 illustrates an example of each of a waveform of a current pulse of a QCL and a waveform of an output voltage of a photosensor in the measurement unit illustrated in FIG. 12.
Figure 14:
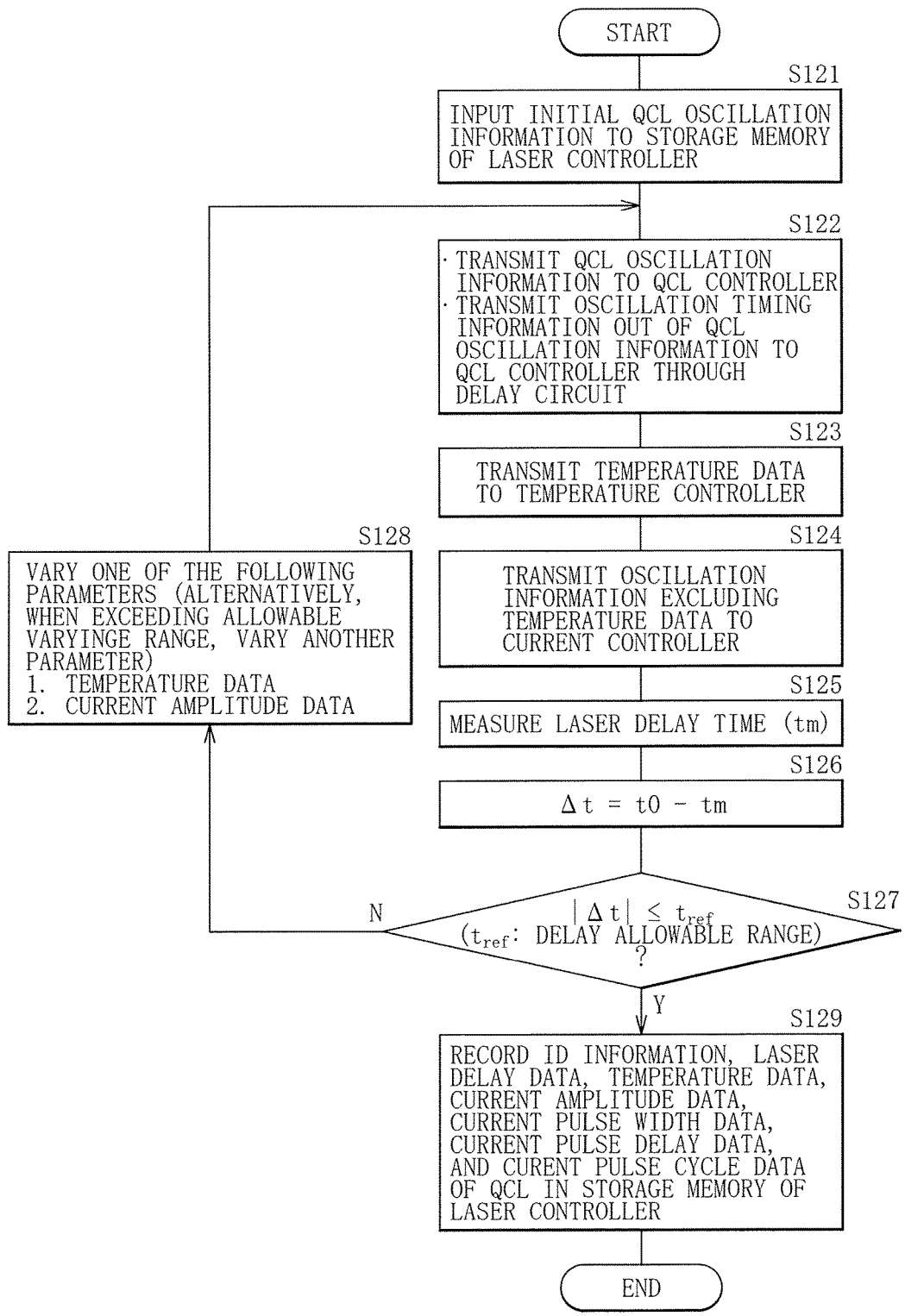
FIG. 14 is a flowchart illustrating an example of an operation of the measurement unit illustrated in FIG. 12.

FIG. 13 illustrates an example of each of a waveform of the current pulse $I_Q$ of the QCL 91 and a waveform of a sensor output voltage of the photosensor 132 in the measurement unit illustrated in FIG. 12. In FIG. 13, the horizontal axis may indicate time. FIG. 14 is a flowchart illustrating an example of an operation of the measurement unit illustrated in FIG. 12.

The initial QCL oscillation information Mi for measurement may be first inputted to the storage memory 151a of the laser controller 151 from the data input device 130 (Step S121). Further, the ID information on the QCL 91 may be inputted to the storage memory 151a from the data input device 130. The initial QCL oscillation information Mi may include initial laser delay data for measurement, initial temperature data Mia for measurement, initial current amplitude data for measurement, initial current pulse width data for measurement, initial current pulse delay data for measurement, and initial current pulse cycle data for measurement.

Next, the laser controller 151 may transmit the initial QCL oscillation information Mi to the QCL controller 152. In this case, initial oscillation timing information Mic of the initial QCL oscillation information Mi may be transmitted to the QCL controller 152 through the delay circuit 153 (Step S122). Further, the initial oscillation timing information Mic may also be transmitted to the waveform measuring device 133 through the delay circuit 153. The initial oscillation timing information Mic may include initial laser delay data and initial current pulse delay data. Further, the laser controller 151 may transmit QCL oscillation information Mid excluding the initial oscillation timing information Mic to the QCL controller 152 on the basis of the initial QCL oscillation information Mi.

Next, the initial temperature data Mia may be transmitted to the temperature controller 91a on the basis of the temperature control information included in the QCL oscillation information Mid (Step S123). The temperature controller 91a may keep the QCL 91 at a predetermined temperature on the basis of the initial temperature data Mia.

Next, initial QCL oscillation information Mib excluding the initial temperature data Mia may be transmitted to the current controller 91b from the QCL controller 152 (Step S124).

Next, the waveform measuring device 133 may measure the laser delay time tm (Step S125). The measurement of the laser delay time tm by the waveform measuring device 133 may be performed as described below. The QCL 91 may oscillate and emit light at a predetermined timing on the basis of the QCL oscillation information Mib, thus outputting the laser light of a predetermined pulse. The laser light from the QCL 91 may enter the $CO_2$ gas cell 136 or the $CO_2$ amplifier 131. The photosensor 132 may output, to the waveform measuring device 133, a sensor output signal S21 corresponding to light intensity of a pulse of the laser light from the QCL 91. Here, the $CO_2$ gas cell 136 or the $CO_2$ amplifier 131 that is not in an excitation state may absorb the pulse of the laser light and output the absorbed pulse of the laser light only at a timing at which the laser light from the QCL 91 has a wavelength of the laser light that is absorbed by $CO_2$ molecules. This may allow for observation of the waveform as illustrated in FIG. 13, as the sensor output voltage of the photosensor 132. The waveform measuring device 133 may measure the laser delay time tm that is a timing of the absorption by the $CO_2$ molecules as illustrated in FIG. 13, from the oscillation timing information Mic and the sensor output signal S21.

The waveform measuring device 133 may output, to the laser controller 151, a signal indicating the laser delay time tm. The laser controller 151 may calculate the expression $\Delta t = t0 - tm$ to determine the $\Delta t$ that is a difference between the laser delay time tm and an aimed laser delay time (t0) (Step S126).

Next, the laser controller 151 may determine whether a condition of $|\Delta t| \leq t_{ref}$ ($t_{ref}$: delay allowable range) is satisfied, i.e., whether an absolute value of the $\Delta t$ is within the delay allowable range (Step S127). When determination is made that the condition of $|\Delta t| \leq t_{ref}$ is not satisfied, i.e., the absolute value of the $\Delta t$ is not within the delay allowable range (Step S127; N), the laser controller 151 may next vary one of data, excluding the current pulse delay data, of the plurality of oscillation parameters included in the initial QCL oscillation information Mi (Step S128), and the laser controller 151 may return to the processing of Step S122. In this case, when a certain first oscillation parameter data exceeds an allowable varying range, the laser controller 151 may vary another second oscillation parameter data. The oscillation parameter data to be varied, among data of the plurality of oscillation parameters, may include at least the temperature data Mia and the current amplitude data. For example, in a case where the processing of Step S128 is to be performed again after the temperature data Mia is varied to return to the processing of Step 122, the current amplitude data may be varied when the temperature data Mia exceeds the allowable varying range.

In contrast, when determination is made that the condition of $|\Delta t| \leq t_{ref}$ is satisfied, i.e., the absolute value of the $\Delta t$ is within the delay allowable range (Step S127; Y), the laser controller 151 may record, as the specific oscillation information, data in the case of satisfying the condition in the storage memory 151a (Step S129). The specific oscillation information may be recorded as the QCL oscillation information M1. Thereafter, the processing may be completed. Non-limiting examples of the data recorded as the specific oscillation information may include the laser delay data, specific temperature data M1a, the current amplitude data, the current pulse width data, the current pulse delay data, and the current pulse cycle data. In addition, the ID information on the QCL 91 may also be included.

[4.2.3 Workings]

According to the measurement unit, it is possible to measure the laser delay time tm on the basis of the timing at which the laser light from the QCL 91 has a wavelength of the laser light that is absorbed by $CO_2$ molecules. Further, it is possible to vary the laser delay time tm by varying the initial QCL oscillation information Mi, thus allowing for recording of the QCL oscillation information M1, as the specific oscillation information, obtained at a timing at which the laser delay time tm reaches a predetermined time.

[4.3 Second Example of Measurement Unit]

[4.3.1 Configuration]

Figure 15:
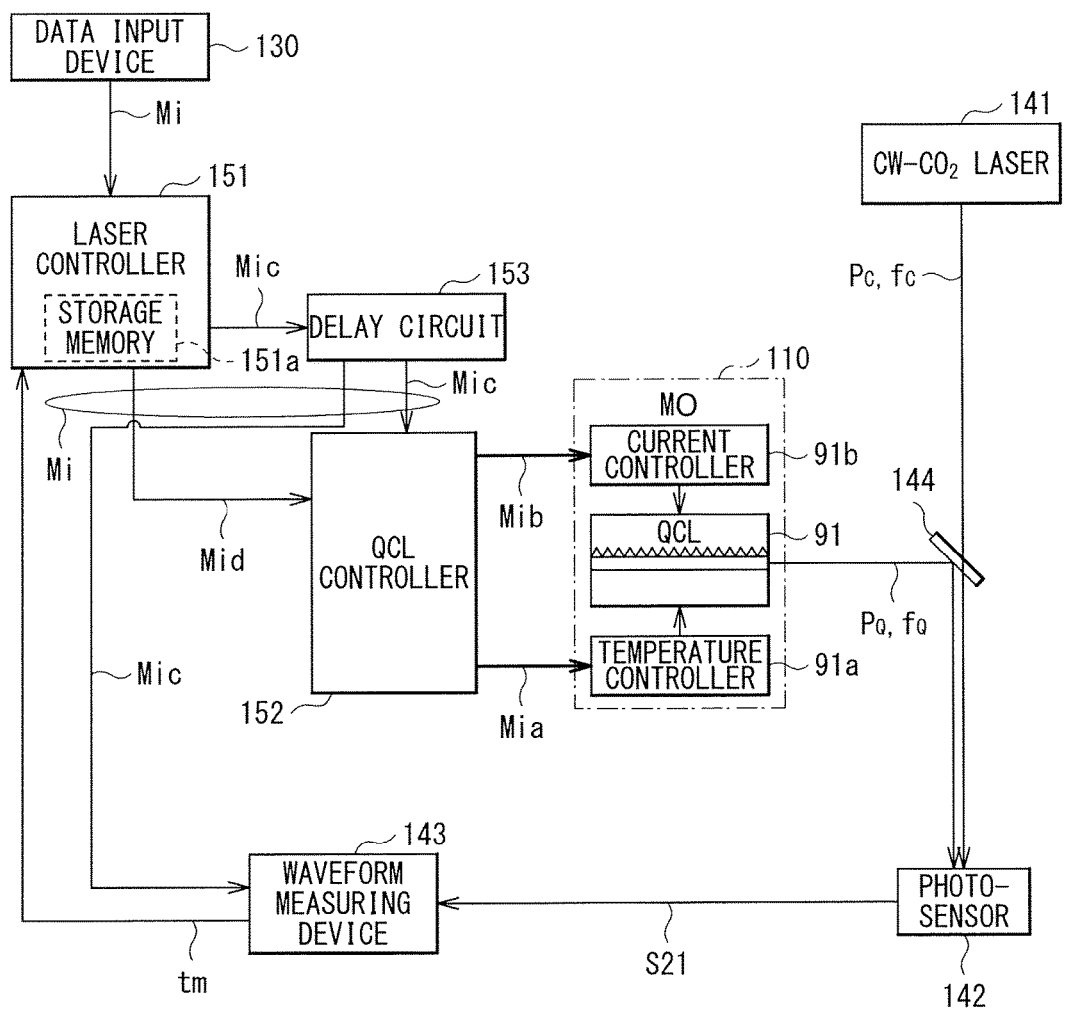
FIG. 15 schematically illustrates a second configuration example of the measurement unit according to the first embodiment.

FIG. 15 schematically illustrates a second configuration example of the measurement unit according to the first embodiment. The measurement unit illustrated in FIG. 15, as with the measurement unit illustrated in FIG. 12, may be a unit that measures the laser delay data in association with the temperature data and the current amplitude data of the QCL 91, in order to specify the QCL oscillation information M1 for use in the laser apparatus 3A illustrated in FIG. 7.

The measurement unit may include a continuous wave (CW)—$CO_2$ laser 141, a photosensor 142, a waveform measuring device 143, and an optical multiplexer 144.

The optical multiplexer 144 may be disposed in the optical path of the laser light from the QCL 91. The optical multiplexer 144 may be a beam splitter. The optical multiplexer 144 may be an optical component having specific reflectance and specific transmittance with respect to the laser light outputted from the QCL 91.

The CW—$CO_2$ laser 141 may output continuous light as laser light for measurement. The optical multiplexer 144 may be disposed to allow respective optical paths of the laser light for measurement outputted from the CW—$CO_2$ laser 141 and the laser light outputted from the QCL 91 to substantially coincide with each other. The optical multiplexer 144 may multiplex the laser light for measurement outputted from the CW—$CO_2$ laser 141 and the laser light outputted from the QCL 91 to output multiplexed laser light.

The photosensor 142 may be disposed in an optical path of the multiplexed laser light of the laser light for measurement outputted from the CW—$CO_2$ laser 141 and the laser light outputted from the QCL 91. The photosensor 142 may output the sensor output signal S21 corresponding to intensity of the multiplexed laser light. The waveform measuring device 143 may measure a waveform of the sensor output signal S21.

The CW—$CO_2$ laser 141, the photosensor 142, the waveform measuring device 143, and the optical multiplexer 144 may configure a measuring device that measures the laser delay time tm. The laser delay time tm may be a time period from the oscillation start timing Ti2 of the QCL 91 to a timing at which the wavelength of the laser light outputted from the QCL 91 is equal to the predetermined wavelength.

The photosensor 142 may be disposed in the optical path of the multiplexed laser light into which the laser light for measurement outputted from the CW—$CO_2$ laser 141 and the laser light outputted from the QCL 91 have been multiplexed. The photosensor 142 may be a photodetector that responds to light intensity of the laser light outputted from the QCL 91 and light intensity of the laser light for measurement outputted from the CW—$CO_2$ laser 141. The photosensor 142 may have a response band of at least several hundred MHz or higher. For example, PEM-10.6 available from Vigo System S.A. located in Warsaw, Poland may be used.

The photosensor 142 may be coupled to the waveform measuring device 143. An oscilloscope, for example, may be used as the waveform measuring device 143. The delay circuit 153 may be coupled to the waveform measuring device 143.

Other configurations may be substantially similar to those of the measurement unit illustrated in FIG. 12.

[4.3.2 Operation]

Figure 16:
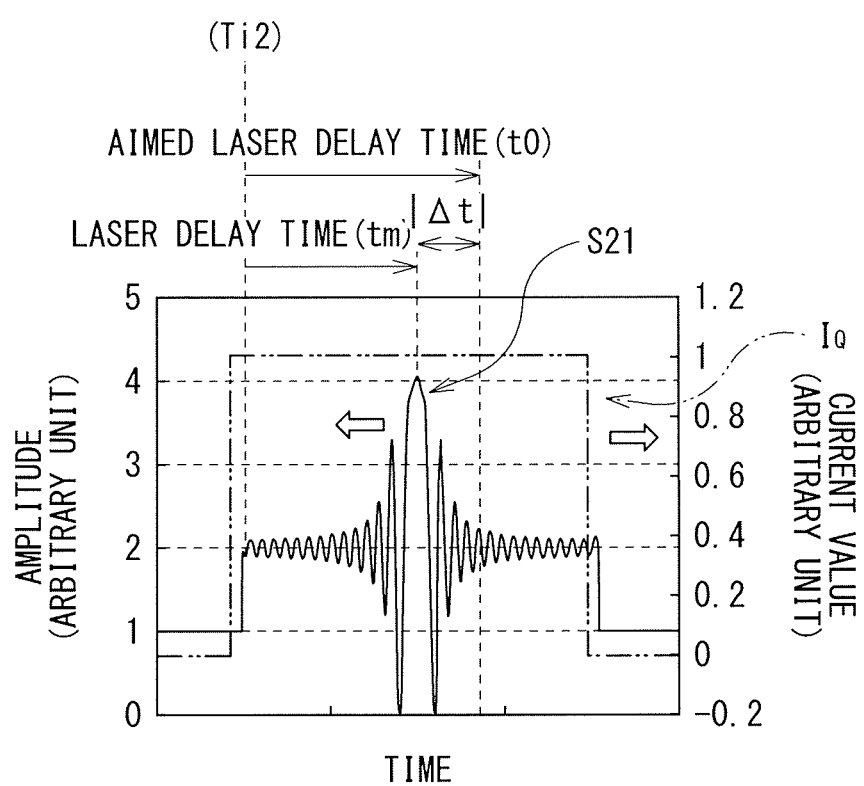
FIG. 16 illustrates an example of an output waveform of a photosensor in the measurement unit illustrated in FIG. 15.

FIG. 16 illustrates an example of a waveform of the sensor output signal S21 of the photosensor 142 in the measurement unit illustrated in FIG. 15. In FIG. 16, the horizontal axis may indicate time. In FIG. 16, the vertical axis on left side may indicate amplitude of the sensor output signal S21. In FIG. 16, the vertical axis on right side may indicate a current value of the current pulse $I_Q$ of the QCL 91.

The QCL 91 may output a pulse of the laser light having light intensity $P_Q$ and light frequency $f_Q$. The CW—$CO_2$ laser 141 may output, as the laser light for measurement, continuous light having the light intensity $P_C$ and the light frequency $f_C$.

The pulse of the laser light outputted from the QCL 91 and the laser light for measurement outputted as the continuous light from the CW—$CO_2$ laser 141 are multiplexed in the optical multiplexer 144, and the multiplexed laser light may enter the photosensor 142.

At a light receiving surface of the photosensor 142, the pulse of the laser light outputted from the QCL 91 and the laser light for measurement outputted from the CW—$CO_2$ laser 141 may cause occurrence of an interference phenomenon. The photosensor 142 having light receiving sensitivity of R with respect to light intensity may obtain an output signal $I_{PD}$ due to the interference phenomenon. The output signal $I_{PD}$ may fluctuate cyclically with the lapse of time as a known optical heterodyne detection signal. Note that the $I_{PD}$ may be represented as the following expression.

$$I_{PD} = R \cdot [P_C + P_Q + 2(P_C \cdot P_Q)^{1/2} \cdot \cos\{2\pi(f_C - f_Q)t\}]$$

The photosensor 142 may output the output signal $I_{PD}$ as the sensor output signal S21.

The output signal $I_{PD}$ may have a vibration cycle that becomes larger as the light frequency $f_Q$ comes closer to the light frequency $f_C$ and becomes smaller as the light frequency $f_Q$ moves away from the light frequency $f_C$. The light frequency $f_C$ of the continuous light of the CW—$CO_2$ laser 141 may be constant, whereas the light frequency $f_Q$ of the pulse of the laser light outputted from the QCL 91 may vary due to chirping with the lapse of time.

The sensor output signal S21 of the photosensor 142 may be inputted to the waveform measuring device 143. The waveform measuring device 143 may observe a vibration waveform as illustrated in FIG. 16.

The waveform measuring device 143 may measure the laser delay time tm from the oscillation timing information Mic and a timing at which the vibration cycle of the vibration waveform is maximum.

Other operations may be substantially similar to those of the measurement unit illustrated in FIG. 12.

[4.3.3 Workings]

According to the measurement unit, it is possible to measure the laser delay time tm on the basis of the interference phenomenon between the laser light from the QCL 91 and the laser light for measurement outputted from the CW—$CO_2$ laser 141. Further, it is possible to vary the laser delay time tm by varying the initial QCL oscillation information Mi, thus allowing for recording of the QCL oscillation information M1, as the specific oscillation information, obtained at a timing at which the laser delay time tm reaches a predetermined time.

In the measurement unit in FIG. 12, when the light intensity of the laser light outputted from the QCL 91 is low, it may be difficult to specify a timing of the absorption by the $CO_2$ molecules, thus resulting in low measuring precision of the laser delay time tm. In the measurement unit that utilizes the interference phenomenon illustrated in FIG. 15, it may be possible to measure the laser delay time tm at high precision even when the light intensity of the laser light outputted by the QCL 91 is low.

5. Second Embodiment

[Laser Apparatus Including a Plurality of QCLs]

Description is given next of a laser apparatus according to a second embodiment of the present disclosure. Note that, in the following, substantially the same elements of the laser apparatus 3A according to the first embodiment are denoted with the same reference numerals, and description thereof is omitted where appropriate.

[5.1 Configuration]

Figure 17:
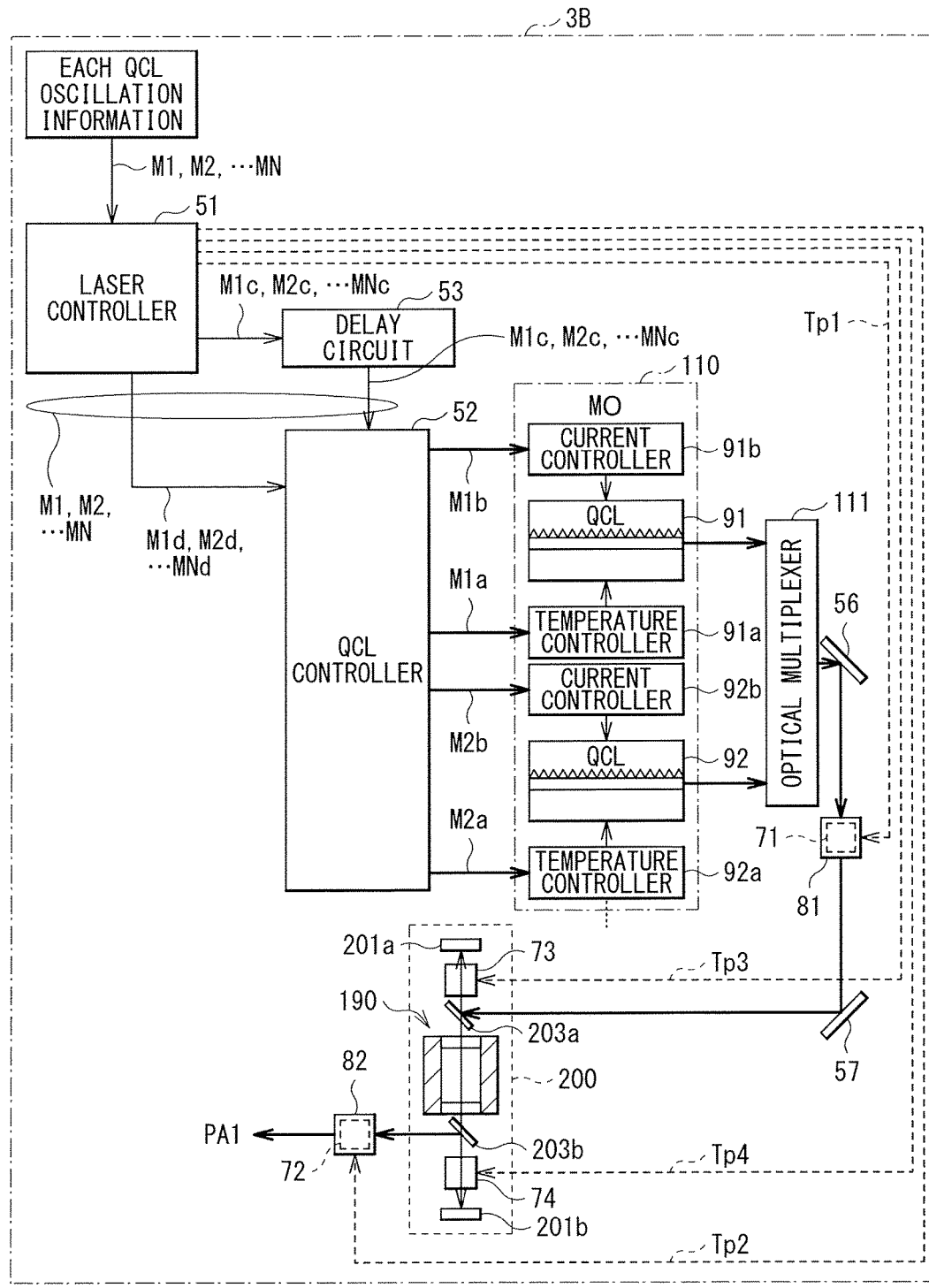
FIG. 17 schematically illustrates a configuration example of a laser apparatus according to a second embodiment.

FIG. 17 schematically illustrates a configuration example of a laser apparatus 3B according to a second embodiment of the present disclosure.

In the laser apparatus 3B according to the embodiment, a plurality of QCLs 91, 92, ... and 9N may be disposed in the MO 110. The laser apparatus 3B may include temperature controllers 91a, 92a, ... and 9Na that control respective temperatures of the QCLs 91, 92, ... and 9N, and current controllers 91b, 92b, ... and 9Nb that control respective supplied currents to the QCLs 91, 92, ... and 9N. Note that, in FIG. 17, only two QCLs, i.e., the QCLs 91 and 92 are illustrated, while the third and subsequent QCLs, i.e., QCL 93, ... QCL 9N are omitted.

The laser apparatus 3B may include the optical multiplexer 111. The optical multiplexer 111 may allow the optical paths of the beams of the laser light outputted from the respective QCLs 91, 92, ... and 9N to substantially coincide with one another to output the respective beams of the laser light.

Other configurations may be substantially similar to those of the laser apparatus 3A illustrated in FIG. 7.

[5.2 Operation]

Figure 18:
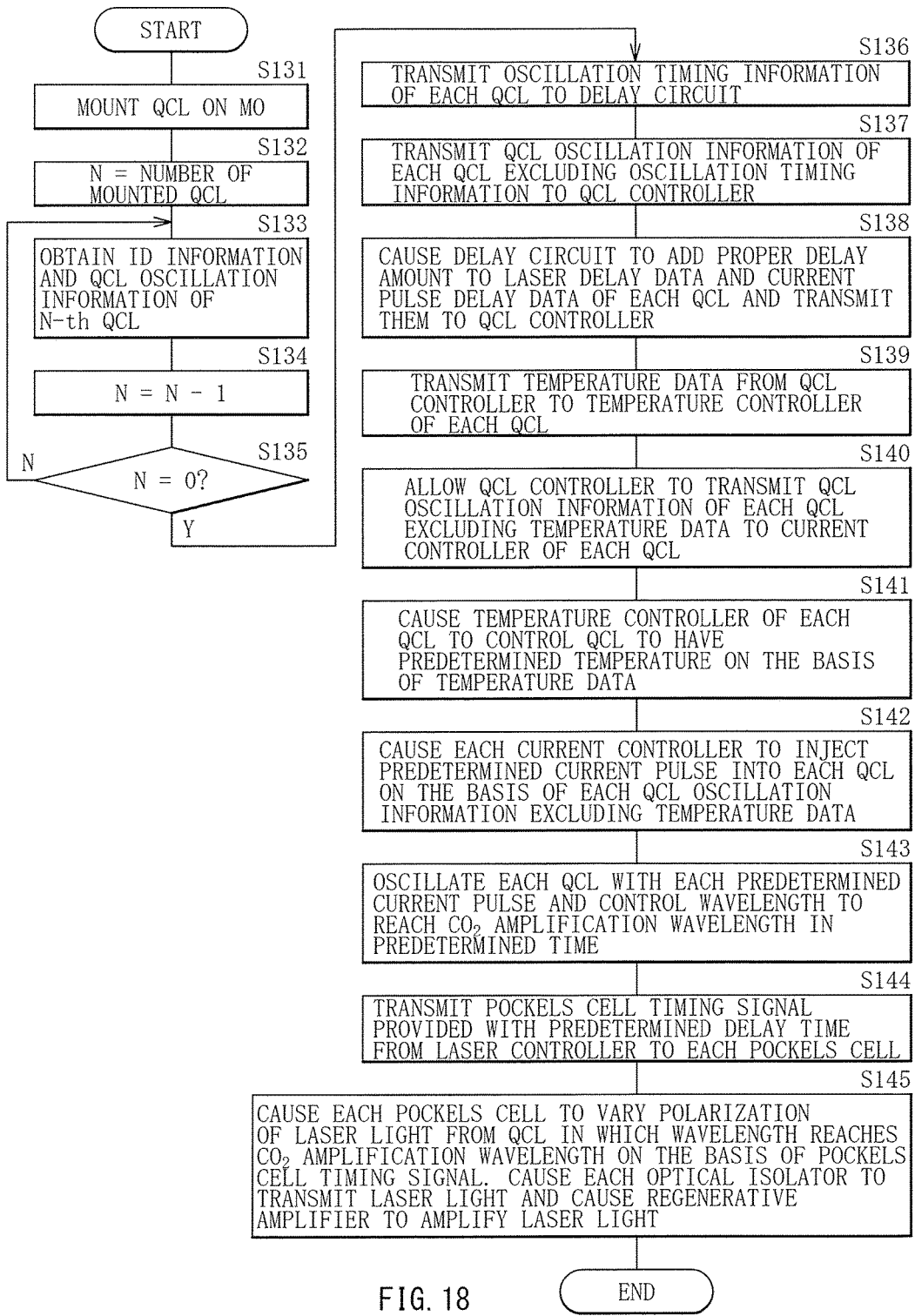
FIG. 18 is a flowchart illustrating an example of an operation of the laser apparatus illustrated in FIG. 17.

FIG. 18 is a flowchart illustrating an example of an operation of the laser apparatus 3B.

The plurality of QCLs 91, 92, ... and 9N may be first mounted on the MO 110 (Step S131). The mounting of the QCLs 91, 92, ... and 9N may be detected through surveillance, by the laser controller 51, of a coupling state of an unillustrated signal line that is coupled to each of the QCLs 91, 92, ... and 9N. Alternatively, a proximity switch, for example, may be used to detect whether each of the QCLs 91, 92, ... and 9N is mounted. In this case, the laser controller 51 may count the number of QCLs mounting of which is detected to set such that N is equal to the number of QCLs that are mounted (N=number of mounted QCLs) (Step S132).

Next, the laser controller 51 may obtain ID information and QCL oscillation information MN of the N-th QCL 9N (Step S133). The laser controller 51 may obtain the ID information and the QCL oscillation information MN from the unillustrated database coupled to the laser controller 51. Alternatively, the laser controller 51 may obtain the ID information and the QCL oscillation information MN through an input by an operator via the unillustrated console. During the input by the operator, the portable storage medium may be used. Alternatively, the ID information and the QCL oscillation information MN may be inputted to the laser controller 51 from the external unit via the wire communication line or the wireless communication line.

Next, the laser controller 51 may set such that N is decremented by 1 (N=N−1) (Step S134). Next, the laser controller 51 may determine whether N is equal to zero (0) (N=0) (Step S135). When determination is made that N is not equal to zero (0) (N≠0) (Step S135; N), the laser controller 51 may return to the processing of Step S133.

In contrast, when determination is made that N is equal to zero (0) (N=0) (Step S135; Y), the laser controller 51 may then transmit, to the delay circuit 53, oscillation timing information M1c, M2c, ... and MNc of the respective QCLs 91, 92, ... and 9N (Step S136).

Next, the laser controller 51 may transmit, to the QCL controller 52, QCL oscillation information M1d, M2d, ... and MNd of the respective QCLs 91, 92, ... and 9N excluding the oscillation timing information M1c. M2c, ... and MNc (Step S137).

Next, the laser controller 51 may cause the delay circuit 53 to add, as the delay time t6, the proper delay amount to the laser delay data and the current pulse delay data of each of the QCLs 91, 92, ... and 9N, and may transmit, to the QCL controller 52, the data of each of the QCLs 91, 92, ... and 9N with the delay time t6 being added (Step S138). The laser controller 51 may set the delay circuit 53 to add, as the delay time t6, the proper delay amount to the oscillation timing information M1c, M2c, ... and MNc of the respective QCLs 91, 92, ... and 9N. The QCL controller 52 may receive the oscillation timing information M1c, M2c, ... and MNc with the delay time t6 being added as the proper delay amount. Next, temperature data M1a, M2a, ... and MNa may be transmitted from the QCL controller 52 to the temperature controllers 91a. 92a, ... and 9Na of the respective QCLs 91, 92, ... and 9N on the basis of the temperature control information included in the QCL oscillation information Mid, M2d, ... and MNd (Step S139).

Next, the QCL controller 52 may transmit, to the current controllers 91b, 92b, ... and 9Nb of the respective QCLs 91, 92, ... and 9N, QCL oscillation information M1b, M2b, ... and MNb of the respective QCLs 91, 92, ... and 9N excluding the temperature data M1a, M2a, ... and MNa (Step S140).

Next, the laser controller 51 may cause the temperature controllers 91a, 92a, ... and 9Na of the respective QCLs 91, 92, ... and 9N to control the respective QCLs 91, 92, ... and 9N to have a predetermined temperature, on the basis of the corresponding temperature data M1a, M2a, ... and MNa (Step S141).

Next, the laser controller 51 may cause the current controllers 91b, 92b, ... and 9Nb to inject the predetermined current pulse $I_Q$ into the respective QCLs 91, 92, ... and 9N on the basis of the corresponding QCL oscillation information M1b, M2b, ... and MNb excluding the temperature data M1a, M2a, ... and MNa (Step S142).

Next, the laser controller 51 may cause the current controllers 91b, 92b, ... and 9Nb to oscillate the respective QCLs 91, 92, ... and 9N with predetermined respective current pulses $I_Q$, and to control the wavelength to reach the $CO_2$ amplification wavelength in predetermined time (Step S143). Thereafter, the Pockels cell timing signals Tp1 to Tp4 provided with the predetermined delay time may be transmitted, respectively, to the first to fourth Pockels cells 71 to 74 from the laser controller 51 (step S144).

Next, the first to fourth Pockels cells 71 to 74 may vary, on the basis of the corresponding Pockels cell timing signals Tp1 to Tp4, polarization of the laser light from a QCL in which the wavelength reaches the $CO_2$ amplification wavelength, among the QCLs 91, 92, . . . and 9N. This may cause the first and second optical isolators 81 and 82 to transmit the laser light. The regenerative amplifier 200 may also amplify the laser light (Step S145). Thereafter, the processing may be completed.

Other operations may be substantially similar to those of the laser apparatus 3A illustrated in FIG. 7.

[5.3 Workings]

According to the laser apparatus 3B of the embodiment, it is possible to control the oscillation of the QCLs 91, 92, . . . and 9N to allow the wavelength of the laser light to be equal to the predetermined wavelength at the aimed timing Ta on the basis of a plurality of corresponding pieces of QCL oscillation information M1, M2, . . . and MN. This makes it possible to synchronize the timing at which the laser light is applied to the target 27 with the timing at which the laser light of the predetermined wavelength is outputted from each of the QCLs 91, 92, . . . and 9N. The predetermined wavelength is amplifiable with an amplifier such as the regenerative amplifier 200.

6. Third Embodiment

[Laser Apparatus Provided with Measurement Function]

Description is given next of a laser apparatus according to a third embodiment of the present disclosure. Note that, in the following, substantially the same elements of the laser apparatuses 3A and 3B according to the first and second embodiments are denoted with the same reference numerals, and description thereof is omitted where appropriate.

[6.1 Configuration]

Figure 19:
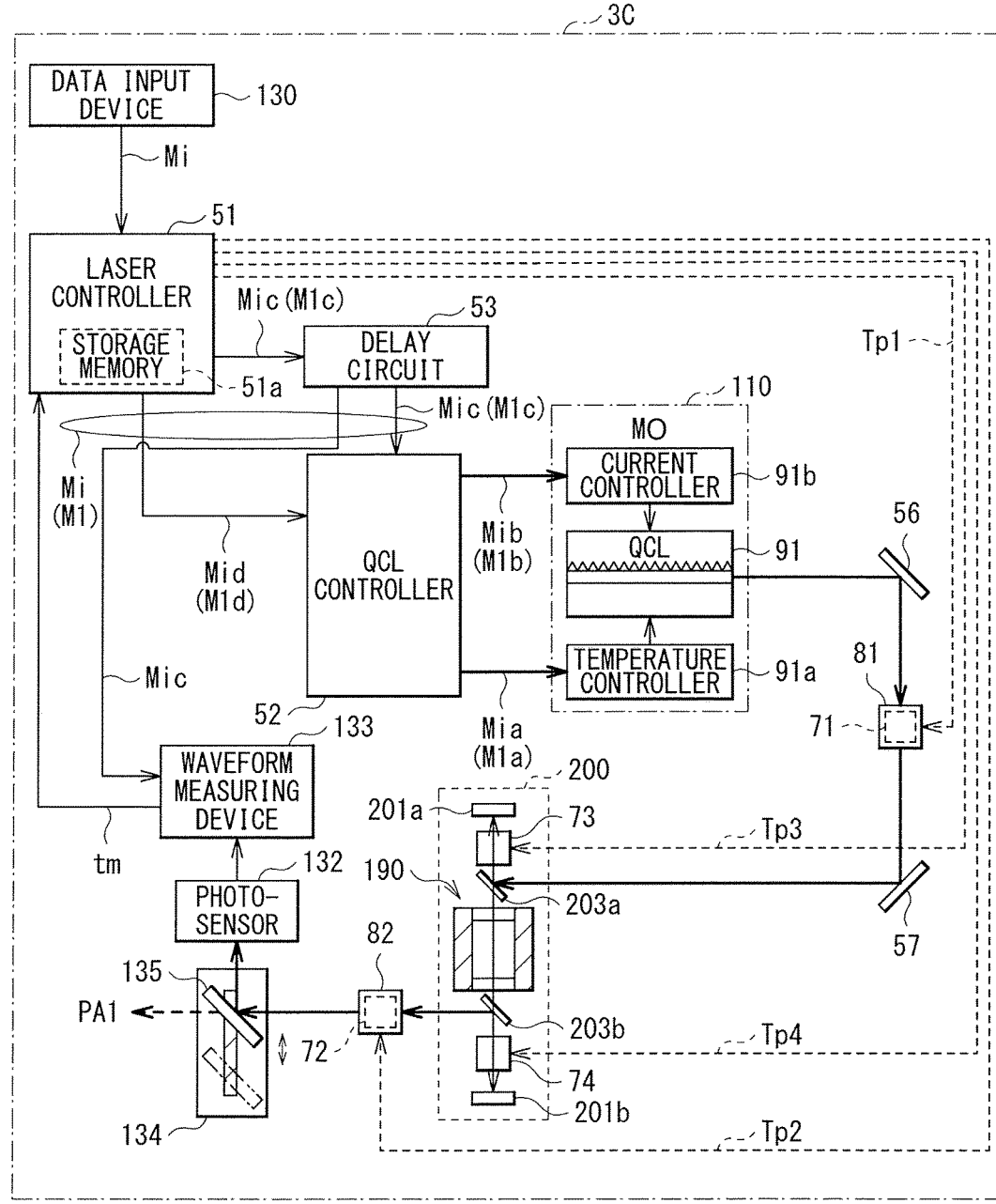
FIG. 19 schematically illustrates a configuration example of a laser apparatus according to a third embodiment.

FIG. 19 schematically illustrates a configuration example of a laser apparatus 3C according to a third embodiment of the present disclosure. The laser apparatus 3C illustrated in FIG. 19 is similar to the laser apparatus 3A illustrated in FIG. 7 except being provided with the function of the measurement unit illustrated in FIG. 12.

The laser apparatus 3C may include the data input device 130, the photosensor 132, the waveform measuring device 133, a uniaxial stage 134, and a movable mirror 135.

The uniaxial stage 134 may be disposed in an optical path on downstream side of the laser light outputted from the regenerative amplifier 200.

The movable mirror 135 may be placed in the uniaxial stage 134. In the uniaxial stage 134, the movable mirror 135 may be configured to be movable with respect to the laser optical path. The uniaxial stage 134 may be coupled to the laser controller 51.

The photosensor 132 may be disposed to allow the laser light reflected by the movable mirror 135 to enter the photosensor 132. The waveform measuring device 133 may be coupled to each of the laser controller 51 and the delay circuit 53.

The laser controller 51 may include a storage memory 51a.

Other configurations may be substantially similar to any of the configurations of the laser apparatus 3A illustrated in FIG. 7 and the configurations of the measurement unit illustrated in FIG. 12.

[6.2 Operation]

Figure 20:
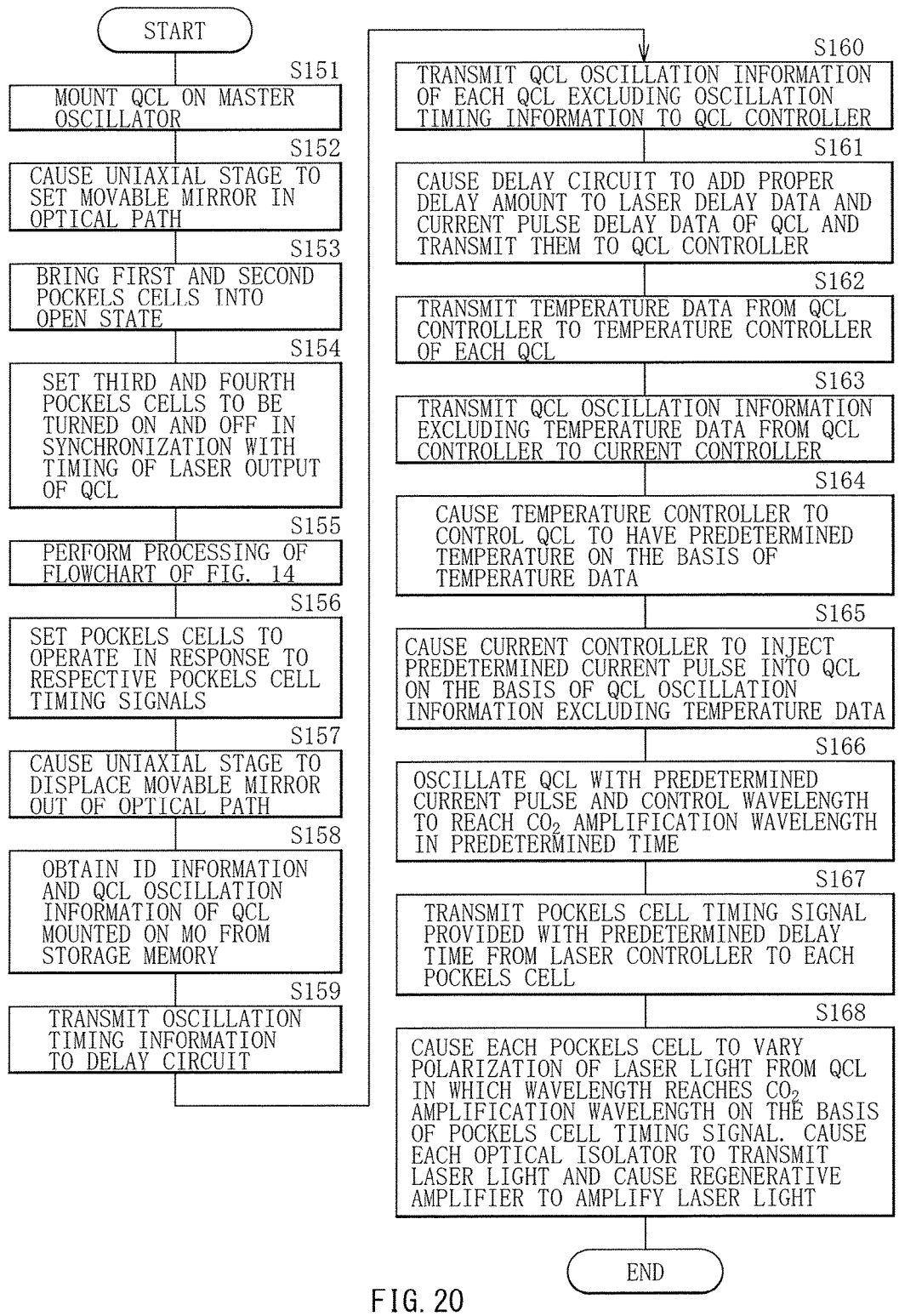
FIG. 20 is a flowchart illustrating an example of an operation of the laser apparatus illustrated in FIG. 19.

FIG. 20 is a flowchart illustrating an example of an operation of the laser apparatus 3C.

The QCL 91 may be first mounted on the MO 110 (Step S151). Next, the laser controller 51 may cause the uniaxial stage 134 to dispose the movable mirror 135 in the optical path of the laser light (Step S152). Thereafter, the laser controller 51 may bring the first and second Pockels cells 71 and 72 into an open state, and may bring the first and second optical isolators 81 and 82 into an open state (Step S153).

Next, the laser controller 51 may set the third and fourth Pockels cells 73 and 74 so as to be turned on and off in synchronization with the timing of the laser output of the QCL 91 (Step S154). In this case, the laser controller 51 may be so set as to control the third and fourth Pockels cells 73 and 74. The control of the third and fourth Pockels cells 73 and 74 may be made to allow the laser light to pass through the amplification medium of the regenerative amplifier 200 at least once every time the QCL 91 outputs the laser light. In this case, when the regenerative amplifier 200 includes the third and fourth Pockels cells 73 and 74 as illustrated in FIG. 3, the laser controller 51 may continue applying a voltage to the third and fourth Pockels cells 73 and 74. When the voltage is continued to be applied to the third and fourth Pockels cells 73 and 74, the laser light may pass through the amplification medium of the regenerative amplifier 200 once, and may be outputted. Some commercially-available Pockels cells perform conversion of polarization of the laser light that enters when no voltage is applied. When such Pockels cells are used for the regenerative amplifier 200, the laser controller 51 may be adapted not to apply a voltage to the third and fourth Pockels cells 73 and 74.

Next, the laser apparatus 3C may perform processing substantially similar to that illustrated in the flowchart of FIG. 14 (Step S155). Next, the laser controller 51 may set the first to fourth Pockels cells 71 to 74 so as to operate in response to the Pockels cell timing signals Tp1 to Tp4, respectively (Step S156).

Next, the laser controller 51 may cause the uniaxial stage 134 to displace the movable mirror 135 out of the optical path (Step S157). Next, the laser controller 51 may obtain, from the storage memory 51a, the ID information and the QCL oscillation information M1 of the QCL 91 mounted on the MO 110 (Step S158). Thereafter, the laser controller 51 may transmit the oscillation timing information M1c to the delay circuit 53 (Step S159).

Next, the laser controller 51 may transmit the QCL oscillation information M1d excluding the oscillation timing information M1c to the QCL controller 52 (Step S160). Thereafter, the laser controller 51 may cause the delay circuit 53 to add, as the proper delay amount, the delay time t6 to the laser delay data and the current pulse delay data of the QCL 91, and may transmit, to the QCL controller 52, the data of the QCL 91 with the delay time t6 being added (Step S161). Thereafter, the temperature data M1a may be transmitted from the QCL controller 52 to the temperature controller 91a (Step S162).

Next, the QCL oscillation information M1b excluding the temperature data M1a may be transmitted from the QCL controller 52 to the current controller 91b (Step S163). Thereafter, the laser controller 51 may cause the temperature controller 91a to control the QCL 91 to have a predetermined temperature on the basis of the temperature data M1a (Step S164). Thereafter, the laser controller 51 may cause the current controller 91b to inject the predetermined current pulse $I_Q$ into the QCL 91 on the basis of the QCL oscillation information M1b excluding the temperature data M1a (Step S165).

Next, the laser controller 51 may cause the current controller 91b to oscillate the QCL 91 with the predetermined current pulse $I_Q$, and to control the wavelength to reach the $CO_2$ amplification wavelength in predetermined time (Step S166). Thereafter, the Pockels cell timing signals Tp1 to Tp4 provided with the predetermined delay time may be transmitted, respectively, to the first to fourth Pockels cells 71 to 74 from the laser controller 51 (step S167).

Next, the laser controller 51 may cause the first to fourth Pockels cells 71 to 74 to vary, on the basis of the corresponding Pockels cell timing signals Tp1 to Tp4, the polarization of the laser light from the QCL 91 in which the wavelength reaches the $CO_2$ amplification wavelength. The laser controller 51 thus may cause the first and second optical isolators 81 and 82 to transmit the laser light. The laser controller 51 may further cause the regenerative amplifier 200 to amplify the laser light (Step S168). Thereafter, the processing may be completed.

Other operations may be substantially similar to those of the laser apparatus 3A illustrated in FIG. 7.

[6.3 Workings]

According to the laser apparatus 3C of the embodiment, it is possible to generate the specific QCL oscillation information M1 with the laser apparatus 3C even when the QCL 91 having unclear specific QCL oscillation information M1 is mounted on the laser apparatus 3C.

Other workings may be substantially similar to those of the laser apparatus 3A illustrated in FIG. 7.

7. Hardware Environment of Controller

A person skilled in the art will appreciate that a general-purpose computer or a programmable controller may be combined with a program module or a software application to execute any subject matter disclosed herein. The program module, in general, may include one or more of a routine, a program, a component, a data structure, and so forth that each causes any process described in any example embodiment of the present disclosure to be executed.

Figure 21:
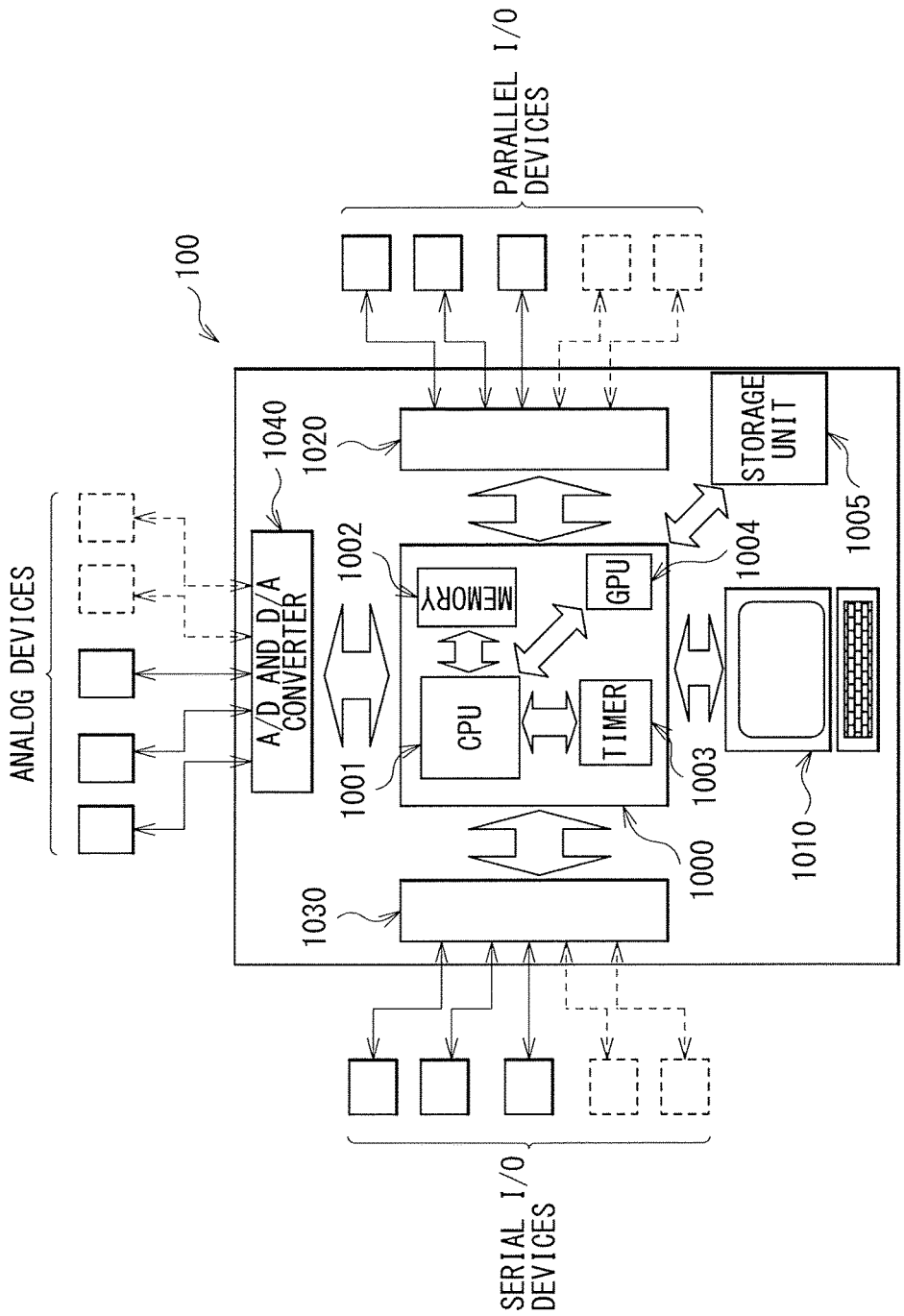
FIG. 21 illustrates an example of a hardware environment of a controller.

FIG. 21 is a block diagram illustrating an exemplary hardware environment in which various aspects of any subject matter disclosed therein may be executed. An exemplary hardware environment 100 in FIG. 21 may include a processing unit 1000, a storage unit 1005, a user interface 1010, a parallel input/output (I/O) controller 1020, a serial I/O controller 1030, and an analog-to-digital (A/D) and digital-to-analog (D/A) converter 1040. Note that the configuration of the hardware environment is not limited thereto.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially-available processor. A dual microprocessor or any other multi-processor architecture may be used as the CPU 1001.

The components illustrated in FIG. 21 may be coupled to one another to execute any process described in any example embodiment of the present disclosure.

Upon operation, the processing unit 1000 may load programs stored in the storage unit 1005 to execute the loaded programs. The processing unit 1000 may read data from the storage unit 1005 together with the programs, and may write data in the storage unit 1005. The CPU 1001 may execute the programs loaded from the storage unit 1005. The memory 1002 may be a work area in which programs to be executed by the CPU 1001 and data to be used for operation of the CPU 1001 are held temporarily. The timer 1003 may measure time intervals to output a result of the measurement to the CPU 1001 in accordance with the execution of the programs. The GPU 1004 may process image data in accordance with the programs loaded from the storage unit 1005, and may output the processed image data to the CPU 1001.

The parallel I/O controller 1020 may be coupled to parallel I/O devices operable to perform communication with the processing unit 1000, and may control the communication performed between the processing unit 1000 and the parallel I/O devices. Non-limiting examples of the parallel I/O devices may include the laser controllers 51 and 151, the QCL controllers 52 and 152, and the waveform measuring devices 133 and 143. The serial I/O controller 1030 may be coupled to a plurality of serial I/O devices operable to perform communication with the processing unit 1000, and may control the communication performed between the processing unit 1000 and the plurality of serial I/O devices. Non-limiting examples of the serial I/O devices may include the uniaxial stage 134. The A/D and D/A converter 1040 may be coupled to analog devices such as various kinds of sensors through respective analog ports. Non-limiting examples of the sensors may include the photosensors 132 and 142. The A/D and D/A converter 1040 may control communication performed between the processing unit 1000 and the analog devices, and may perform analog-to-digital conversion and digital-to-analog conversion of contents of the communication.

The user interface 1010 may provide an operator with display showing a progress of the execution of the programs executed by the processing unit 1000, such that the operator is able to instruct the processing unit 1000 to stop execution of the programs or to execute an interruption routine.

The exemplary hardware environment 100 may be applied to one or more of configurations of the EUV light generation controller 5, the laser controllers 51 and 151, and so forth according to any example embodiment of the present disclosure. A person skilled in the art will appreciate that such controllers may be executed in a distributed computing environment, namely, in an environment where tasks may be performed by processing units linked through any communication network. In any example embodiment of the present disclosure, the EUV light generation controller 5, the laser controllers 51 and 151, and so forth may be coupled to one another through a communication network such as Ethernet (Registered Trademark) or the Internet. In the distributed computing environment, the program module may be stored in each of local and remote memory storage devices.

8. Et Cetera

The foregoing description is intended to be merely illustrative rather than limiting. It should therefore be appreciated that variations may be made in example embodiments of the present disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Further, the singular forms "a", "an", and "the" used in the specification and the appended claims include plural references unless expressly and unequivocally limited to one referent.

What is claimed is:

1. A measurement unit comprising:
a measuring device configured to measure a second delay time, the second delay time being a time period from an oscillation start timing at which a first delay time elapses to a timing at which a wavelength of laser light, outputted on a basis of a supplied current by a quantum cascade laser at the oscillation start timing, is equal to a predetermined wavelength, the measuring device including:
a chamber disposed in an optical path of the laser light, the chamber containing a $CO_2$ gas, the chamber configuring a $CO_2$ amplifier;
a photosensor disposed in the optical path of the laser light, the photosensor being configured to output a sensor signal; and
a waveform measuring device configured to measure a waveform of the sensor signal, the sensor signal corresponding to an intensity of the laser light outputted from the $CO_2$ amplifier that is in a state where the $CO_2$ gas is unexcited; and
a measurement controller configured to control, on a basis of a plurality of oscillation parameters, oscillation of the quantum cascade laser, the measurement controller being configured to vary the second delay time to output specific oscillation information, the oscillation parameters including the first delay time, a current waveform of the supplied current, and a device temperature of the quantum cascade laser, the second delay time being varied by varying one or more of the oscillation parameters excluding the first delay time, the specific oscillation information being information on the oscillation parameters that are at a timing at which the second delay time reaches a predetermined time.

2. The measurement unit according to claim 1, wherein, when a first oscillation parameter of the oscillation parameters exceeds an allowable varying range of the first oscillation parameter, the measurement controller varies a second oscillation parameter of the oscillation parameters.

3. The measurement unit according to claim 1, wherein the waveform measuring device measures, on a basis of the waveform of the sensor signal, an absorption timing at which the laser light is absorbed by the $CO_2$ gas.

4. The measurement unit according to claim 3, wherein the measuring device outputs, to the measurement controller, a time that is a time period from the oscillation start timing to the absorption timing as the second delay time.

* * * * *